(12) United States Patent
Dannels et al.

(10) Patent No.: US 8,502,538 B2
(45) Date of Patent: Aug. 6, 2013

(54) B1 AND/OR B0 MAPPING IN MRI SYSTEM USING K-SPACE SPATIAL FREQUENCY DOMAIN FILTERING WITH COMPLEX PIXEL BY PIXEL OFF-RESONANCE PHASE IN THE B0 MAP

(75) Inventors: Wayne R. Dannels, Mentor, OH (US); Andrew J. Wheaton, Shaker Heights, OH (US)

(73) Assignees: Kabushiki Kaisha Toshiba, Minato-ku, Tokyo (JP); Toshiba Medical Systems Corporation, Otawara-shi, Tochigi (JP)

( * ) Notice: Subject to any disclaimer, the term of this patent is extended or adjusted under 35 U.S.C. 154(b) by 678 days.

(21) Appl. No.: 12/801,117

(22) Filed: May 24, 2010

(65) Prior Publication Data

US 2010/0239151 A1 Sep. 23, 2010

Related U.S. Application Data

(63) Continuation-in-part of application No. 12/382,605, filed on Mar. 19, 2009, now Pat. No. 8,077,955.

(51) Int. Cl.
*G01R 33/24* (2006.01)

(52) U.S. Cl.
USPC ............ 324/318; 324/320; 324/307; 324/309

(58) Field of Classification Search
USPC .. 324/300–322; 600/410, 411; 382/128–131
See application file for complete search history.

(56) References Cited

U.S. PATENT DOCUMENTS

| | | | |
|---|---|---|---|
| 6,771,067 B2 * | 8/2004 | Kellman et al. | 324/307 |
| 7,233,818 B1 * | 6/2007 | Aletras et al. | 600/410 |
| 7,706,857 B2 * | 4/2010 | Aletras et al. | 600/410 |
| 8,077,955 B2 * | 12/2011 | Dannels et al. | 382/131 |
| 8,212,562 B2 * | 7/2012 | Dannels | 324/309 |
| 8,306,289 B1 * | 11/2012 | Meyer et al. | 382/128 |
| 2010/0239142 A1 * | 9/2010 | Dannels et al. | 382/131 |
| 2010/0239151 A1 * | 9/2010 | Dannels et al. | 382/131 |
| 2011/0181282 A1 * | 7/2011 | Dannels | 324/309 |
| 2011/0262021 A1 * | 10/2011 | Liu | 382/131 |

OTHER PUBLICATIONS

Axel, et al., "MR Imaging of Motion with Spatial Modulation of Magnetization," *Radiology*, vol. 171, pp. 841-845 (1989).
Axel, et al., "Heart Wall Motion: Improved Method of Spatial Modulation of Magnetization for MR Imaging," *Radiology*, vol. 172, pp. 349-350 (1989).
Insko, et al., "Mapping of the Radiofrequency Field," *J Magn Reson*, Series A, vol. 103, pp. 82-85 (1993).
Stollberger, et al., "Imaging of the Active $B_1$ Field In Vivo," *Magn Reson Med*, vol. 35, pp. 246-251 (1996).
Dowell, et al., "Fast, Accurate, and Precise Mapping of the RF Field In Vivo Using the 180° Signal Null," *Magn Reson Med*, vol. 58, pp. 622-630 (2007).
Jiru, et al., "Fast 3D Radiofrequency Field Mapping Using Echo-Planar Imaging," *Magn Reson Med*, vol. 56, pp. 1375-1379 (2006).

(Continued)

*Primary Examiner* — Melissa Koval
*Assistant Examiner* — Tiffany Fetzner
(74) *Attorney, Agent, or Firm* — Nixon & Vanderhye PC

(57) ABSTRACT

Frequency filtering of spatially modulated or "tagged" MRI data in the spatial frequency k-space domain with subsequent 2DFT to the spatial domain and pixel-by-pixel arithmetic calculations provide robust data that can be used to derive B1 and/or B0 maps for an MRI system.

17 Claims, 16 Drawing Sheets

(56) References Cited

OTHER PUBLICATIONS

Vaughan, et al., "7T vs. 4T: RF Power, Homogeneity, and Signal-to-Noise Comparison in Head Images," *Magn Reson Med,* vol. 46, pp. 24-30 (2001).

Wang, et al., "Factors Influencing Flip Angle Mapping in MRI: RF Pulse Shape, Slice Select Gradients, Off-Resonance Excitation, and $B_0$ Inhomogeneities," *Magn Reson Med,* vol. 56, pp. 463-468 (2006).

Yarnykh, "Actual Flip Angle Imaging in the Pulsed Steady State: A Method for Rapid Three-Dimensional Mapping of the Transmitted Radiofrequency Field," *Magn Reson Med,* vol. 57, pp. 192-200 (2007).

Bernstein, et al., Handbook of MRI Pulse Sequences, Chapter 10, Elsevier Academic Press, especially pp. 165-171 and 298-299 (2004).

Chen, et al., "Feasibility of Rapid B1 Mapping with RF Prepulse Tagging," Proceedings of ISMRM, 16th Scientific Meeting, Toronto, Canada, May 2008, Abstract #3045.

Chen, et al., "Feasibility of Rapid B1 Mapping with RF Prepulse Tagging," poster presented at Research Showcase 2008, Case Western Reserve University, Veale Convocation Center, Cleveland, Ohio, Apr. 16-17, 2008.

Vlaardingenbroek, et al., *Magnetic Resonance Imaging: Theory and Practice,* Springer-Verlag, pp. 84-87 and 116-118 (1999).

Dannels, et al., "Fast 2D B1 Mapping by K-Space Processing of Tagging Patterns," Proceedings of ISMRM, 18th Scientific Meeting, Stockholm, Sweden, May 2010, Abstract #236.

\* cited by examiner

Untagged Image

Tag effect, amount of saturation
$f\_sat = \cos(2 * tagAlpha * B1)$

Tagged Image =
Untagged Image * Tag Profile

TX B1 profile

Tag Spatial Profile

Peak Envelope and Valley Envelope, which is used for subsequent computation of B1

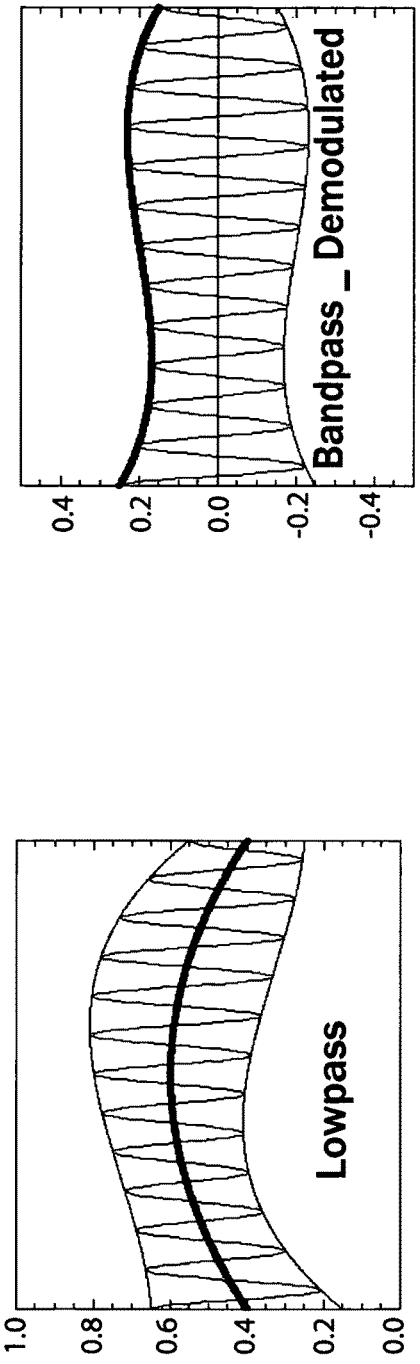

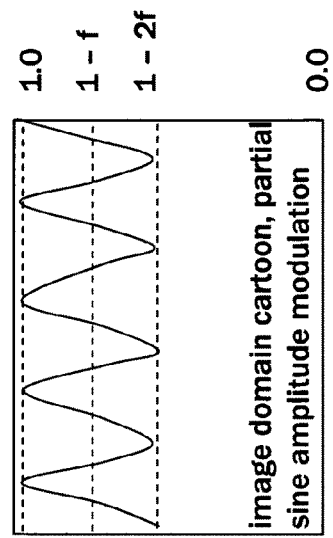
Fig. 13a
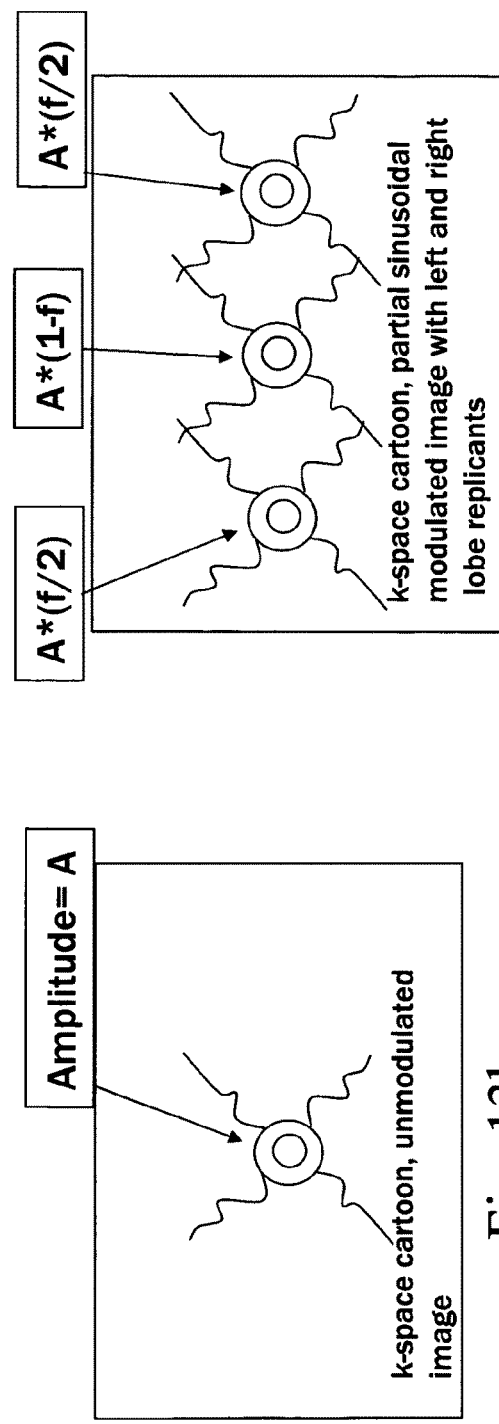
Fig. 13c
Fig. 13b

Fig. 17 Example B1 map

Example B0 map

B1 AND/OR B0 MAPPING IN MRI SYSTEM USING K-SPACE SPATIAL FREQUENCY DOMAIN FILTERING WITH COMPLEX PIXEL BY PIXEL OFF-RESONANCE PHASE IN THE B0 MAP

CROSS-REFERENCE TO RELATED APPLICATION

This application is a continuation-in-part of copending application Ser. No. 12/382,605 filed Mar. 19, 2009, which is hereby incorporated by reference and from which priority rights are claimed under 35 U.S.C. §120.

FIELD

This application describes methods and apparatus for generating multi-dimensional maps of the spatial distribution of radio frequency (RF) magnetic fields (typically labelled as the "B1" field) and/or of the static magnetic field (typically labelled as the "B0" field) in MRI (magnetic resonance imaging) systems. Fast multi-dimensional mapping of B1 and/or B0 is achieved by k-space processing of SPAMM tagging patterns.

BRIEF DESCRIPTION OF THE DRAWINGS

FIGS. 12a-12b graphically depict low-pass and bandpass demodulated data;

FIGS. 13a-13c depict the generation of replicants in k-space generated by partial amplitude modulation (e.g., SPAMM tagging);

DETAILED DESCRIPTION OF EXEMPLARY EMBODIMENTS

Figure 1:
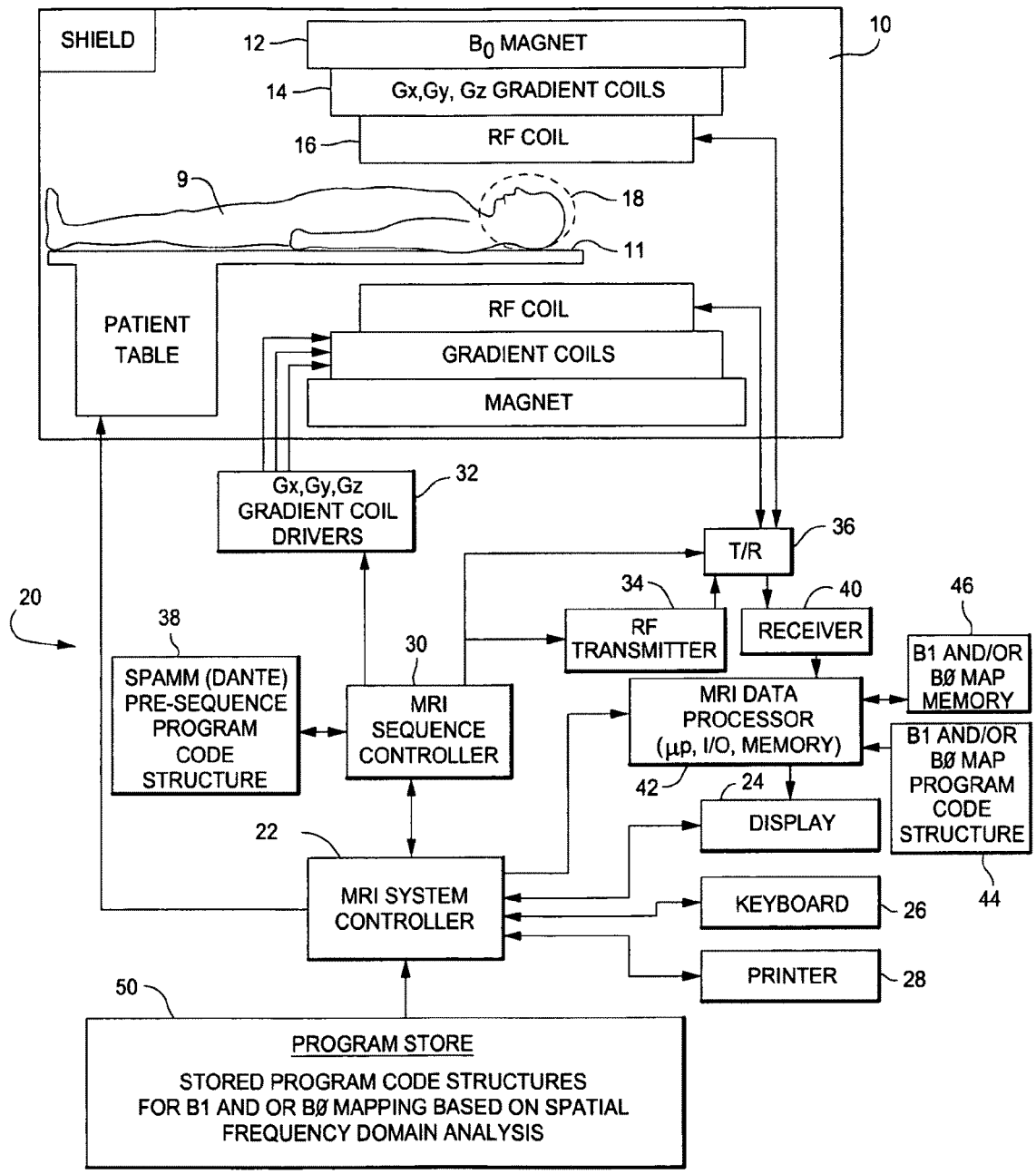
FIG. 1 is a general overall schematic depiction of an exemplary MRI system configured to practice the exemplary embodiments.

Magnetic resonance imaging (MRI) systems are by now well known and many different types of commercially available MRI systems are regularly employed for medical research and/or diagnostic purposes. Although there are many variations in detailed image acquisition processes and/or MRI system geometries, they all share some basic fundamental principles.

For example, MRI systems all utilize the principle of nuclear magnetic resonance (NMR) wherein nuclei having a net magnetic moment (e.g., nuclei having an odd number of protons or neutrons hydrogen nucleus) are immersed in a static background magnetic field B0. Ideally, this background static magnetic field is homogeneous throughout a volume to be imaged (even in the presence of the intervening object to be imaged). This background magnetic field tends to align a significant number of the nuclei magnetic moments therewith so as to produce a rather significant net nuclei magnetization aligned with the homogeneous background magnetic field B0.

The nuclear magnetic moments can be thought of as rotating about an axis at a frequency which is proportional to the magnetic field imposed upon the nucleus at its particular spatial location. The so-called Larmor angular frequency $\omega = \gamma \beta$ where $\gamma$ is a gyromagnetic ratio constant for a given species of nuclei and its structural environment and $\beta$ is the strength of the imposed magnetic field. Accordingly, in an ideal world, a particular species of nuclei having common physical surroundings would all have a common Larmor frequency of rotation. However, by superimposing an auxiliary magnetic field having a linear gradient (e.g., in one of three orthogonal directions x, y, z), it will be appreciated that the Larmor frequency of such common species of nuclei disposed along the changing field gradient will now have different values in accordance with the magnitude of the linear magnetic gradient field at the spatial location of a given nucleus. Again, in an ideal world, such superimposed magnetic gradient field would have only an exactly linear gradient in one desired dimension and would otherwise be uniform and homogeneous. Typically, an MRI system has three sets of gradient coils arranged to impose linear magnetic gradient fields in each of three different mutually orthogonal directions.

By transmitting an RF magnetic field at the Larmor frequency into the volume that is to be imaged, one can selectively "excite" the nuclear magnetic resonant (NMR) nuclei that happen to fall within a given selected volume (e.g., a "slice") so as to nutate the nuclear magnetic moment away from the nominal static magnetic field B0. Depending upon the amplitude and duration of such an exciting RF pulse, the magnetic moment of a nucleus can be "nutated" away from the nominal B0 alignment by controlled amounts (e.g., 90°). After such nutation, the nuclear magnetic moment tends to relax back toward nominal alignment with B0, but with characteristic longitudinal and transverse time constants T1, T2 and, in the process, each relaxing nuclear magnetic moment emits a radio frequency response signal that can be detected as an RF signal having a particular amplitude, frequency and phase (e.g., relative to the exciting RF field and/or to other NMR nuclei emitting RF response signals).

By carefully choosing a particular "MRI sequence" of RF excitation pulse(s) and magnetic gradient pulses, one can elicit meaningful spatially-encoded RF response signals so as to permit construction of an image or map of the NMR nuclei densities throughout a specific volume of the MRI system (e.g., a slice of the "imaging volume"). Over the last several decades of MRI system development, a very large number of MRI sequences have been discovered and commercialized. Since most, if not all, such imaging sequences can be utilized in the following exemplary embodiments, and since such are already well known to those skilled in the art, further detail about specific MRI sequences is not required.

The RF excitation fields transmitted into the imaging volume as well as the RF response fields received from the imaging volume are transmitted and/or received via RF coils which act as RF antennae. Once again, there are many different RF coil geometries well known to those in the art. For example, there may be "head" coils, "surface" coils, "whole body" coils, "multi-coil arrays" and the like. All of these RF antennae/coil structures serve to transduce electromagnetic radio frequency fields to/from NMR nuclei in the imaging volume onto feed line(s) of the RF antennae/coils which are then connected appropriately to RF transmitter and/or receiver circuits (e.g., via a transmit/receive switch if the same coil structure is used to both transmit and receive), as will be apparent to those skilled in the art.

Once again, in a perfect world, the RF antennae/coil sensitivity throughout the volume to be imaged is desirably absolutely uniform and homogeneous at all points within the volume to be imaged.

Unfortunately, the ideals of absolutely uniform homogeneity, absolutely linear gradients, etc., desired for various magnetic/RF fields in the MRI system are not realized in practice. Accordingly, various "shimming" attempts are made to correct for unwanted departures from the ideal and/or to compensate acquired signals that have been adversely affected by such less than ideal circumstances.

This application is directed towards a new and improved technique for mapping of the RF B1 magnetic field associated with transmit sensitivity of the RF antennae/coils of an MRI system and/or the static B0 magnetic field associated with the permanent magnet and/or other aspects of an MRI system that may affect the static B0 magnetic field. Various prior techniques have been used for generating such B1 maps which are then used either to improve the design of the MRI system itself and/or to provide compensated output images from the MRI system (e.g., especially where quantitative measurements are to be made based upon such images). However, such prior techniques leave room for improvement—which the exemplary embodiments explained in detail below provide.

MRI requires both transmitted radio frequency (RF) fields and received radio frequency (RF) fields. These RF fields are often denoted as B1 fields. The transmitted field, in typical usages, should be approximately uniform over the area being imaged within the subject. Spatial inhomogeneities of the RF fields introduce unwanted effects, including various artifacts in images, degradations in image contrast, or degradation or failure of various quantification methods. The transmit field acting within human bodies exhibits greater non-uniformity as main magnet field strength increases. The static magnetic main field is denoted as the B0 field. The effective B1 fields depend both upon the engineering design of the MRI scanner (such as RF antenna/coil and magnet geometry), and the geometry and electromagnetic properties of the subject within the scanner (often a human patient).

Having information about the distribution of non-homogeneity in the transmit B0 and B1 fields within a specific subject can be beneficial in various ways. Advantages of having such data include being able to better interpret images and artifacts, being able to spatially improve the actual field patterns by improved design of the scanner, being able to interactively or dynamically refine the fields on specific subjects and in specific scan areas, and being able to improve or correct the acquired data and/or resulting images. In some more advanced methods, such as "multichannel transmit" or "Transmit SENSE," knowledge of non-uniform spatial field patterns is explicitly needed and explicitly used to accomplish goals of improved RF excitation and spatial localization.

Numerous methods exist or have been proposed for experimentally determining the B1 field. When the information is determined or presented in the form of a 2-D or 3-D spatial distribution, it is called a B1 map.

A pulse sequence can be repeated several times using successive amplitudes of RF excitation (i.e., nutation) pulses. The receive MR signal intensity is known to have a certain functional dependence on the effective B1 transmit amplitude, such as:

$$S(\theta(x,y,z),x,y,z)=[\rho(x,y,z)]*\sin(\theta(x,y,z))^3 \quad \text{[Equation 1]}$$

$$\theta(x,y,z)=RF\_ampl\_factor*(B1\_spatial(x,y,z)) \quad \text{[Equation 2]}$$

where:
  S is measured data (using a pulse sequence acquisition at the scanner for various RF_ampl_factor values), and the unknown value of B1_spatial (i.e., θ or B1_spatial) are the spatial distribution(s) to be determined;
  "S" denotes the MR signal intensity (the actual mathematical functional dependence is based upon the pulse sequence used);
  ρ is a signal strength factor such as the proton density, or a proton density times the receive coil sensitivity, or the like;
  RF_ampl_factor is an independently adjusted control factor (e.g., RF pulse amplitude and duration) in the pulse sequence;
  B1_spatial(x,y,z) is the form of a spatially dependent B1 associated with some reference value of the RF_ampl_factor; and
  θ has the meaning of the spatially dependent effective B1 field.

The specific "S" formulae given above happen to be suitable for a pulse sequence producing a single stimulated echo with complete T1/TR signal recovery, and minimal T1, T2 decay during the echo time, just as an example.

In general, one detects or measures S, from which one can determine θ, from which one can determine B1_spatial. In the literature, sometimes authors compute and report θ, and sometimes they compute and report B1. Converting from one to the other is simple, and the two terms may be used somewhat interchangeably throughout the following description.

To be rigorous, B1_spatial should represent an instantaneous physical measurement of a component of a time-varying magnetic field. θ is the time integral of (γB1), and γ is a gyromagnetic ratio. The time integral can be a simple linear approximation or, more accurately, it can be the result of integrating out the full Bloch equations. These relationships are well known in MRI, and are not discussed further here. Suffice it to say, conversion between B1 and θ is straightforward under typical imaging conditions.

Multiple measurements are generally needed, so that from multiple values of S, it is possible to solve for "ρ" and θ.

Spatially localized images can be collected at a series of amplitudes. Analysis such as searching for a peak, or fitting a curve, can be done to determine the strength of B1. In a simple exemplary case, such as a stimulated echo sequence where $S=S(\theta)=\sin(\theta)^3$, if we assume an approximately uniform B1_spatial(x,y,z), MR data can be collected at each of several RF_ampl_factor values over some nominal range. The RF_ampl_factor which yields the peak of the signal value "S" corresponds to $\theta(x,y,z)=\pi/2$ (flip angle in radians), i.e., at the particular RF_ampl_factor for which S achieves a maximum, B1_spatial=(π/2)/RF_ampl_factor (once again, ignoring other factors such as γ, the RF pulse duration, etc.).

Other pulse sequences can be used, and other features of the signal strength function can be used, such as the first minimum of the signal for a 180° excitation pulse sequence, or such as the most-negative-valued signal for a 180° inversion pulse followed by a sign-sensitive readout.

The successive amplitudes can be controlled by stepping through a range in a prescribed fashion, perhaps linear increments across some nominal range, or by iterative search methods like bisection, etc.

The varying amplitude factor, RF_ampl_factor, can be altered and applied to all RF transmit pulses in a sequence in unison or, alternately, one or a few pulses can be modified, while others are kept constant. For example, in a spin echo pulse sequence with two nutation pulses (α1 and α2), the signal strength can have the form:

$$S(\alpha 1, \alpha 2) = \sin(\alpha 1) * (\sin(0.50\alpha 2))^2,$$

in which case α1 and α2 may be varied together, or either one can be varied independently.

When B1_spatial(x,y,z) is not treated as constant (i.e., spatially homogeneous), a simple but slow technique is to acquire and generate entire 2-D or 3-D images for each of several RF gain factors, and then to analyze the sets of images pixel-by-pixel, to fit or search for an amplitude scaling at each pixel location. Note that while using search algorithms and data-dependent choice of RF_ampl_factor to try to converge to some optimal condition may be a good strategy when B1 is spatially uniform, it is not as suitable when B1 is non-uniform. A value of RF_ampl_factor which achieves a goal such as a signal null at one location will not simultaneously achieve nulls at other locations, for example.

The resulting B1 strengths, or flip angles θ, are then collected and presented or stored in the form of an image, known as a B1 map. It is possible that the B1 value can be treated either as a magnitude or as a complex value which also includes some phase value (relative to a suitable or arbitrary reference phase).

Many acquisition methods are known which can be used to determine B1. Basically, all MRI pulse sequences have dependencies on B1 transmit fields, but some have more favorable characteristics, such as nearly linear dependencies over a range of transmit values, or such as dependencies which are uncoupled from other variables like the tissue T1 and T2 parameters. Corresponding analysis methods also exist, often for specific acquisition methods.

In some cases, a series of many RF pulse amplitudes are used in successive acquisitions. A feature such as a null or minimum in the signal level can then indicate which RF pulse amplitude is the nearest match to a certain flip angle or a certain B1 strength, as previously explained.

Determining θ from S may be done in any of a few ways. There can be some regression or fitting to yield both ρ and S (even though there may be no explicit interest in ρ). There could be a simple search for a simple feature of the signal curve such as a maximum or null. There are ways to collect a few values of S, (perhaps something like S1 using RF_ampl_factor=RF_ampl_factor1, and S2 using RF_ampl_factor=(2 RF_ampl_factor1), then finding a closed form mathematical dependence of θ on S1 and S2, especially where that closed-form dependence has eliminated other variables like ρ.

It is common to collect pairs of images acquired with different numbers of RF pulses, or different amplitudes, and then form ratios of the images. The ratios cancel other factors contributing to image intensity, leaving terms which depend on the RF pulses. The signal ratios have dependencies upon the RF pulse amplitudes which can be computed and inverted.

We have previously described collecting data with a few values of RF_ampl_factor, each using the same pulse sequence and the same acquisition parameters (other than RF_ampl_factor). A variant of this idea is to acquire instead two (or more) pulse sequences, two or more echoes, or the like. In one example, the two basic pulse sequences could be different, and each has a different functional dependence of S on θ (e.g., one spin echo with a saturation or inversion pre-pulse, and a second spin echo without the pre-pulse). In another example, two or more echoes can be acquired in a single, more complicated, pulse sequence (e.g., a spin echo and a stimulated echo, or some kind of first RF echo and second RF echo). In yet another example, a pulse sequence can be run with two sets of parameters, such as a short TR and a long TR, perhaps in an interleaved fashion.

It is known that RF tagging techniques (including "SPAMM") depend upon RF amplitudes, and so they can be used for determining B1 spatial dependencies (B1 maps).

In SPAMM RF tagging, two or more similar RF tagging nutation pulses are applied, and a pulsed gradient is applied in between them. The gradient causes spatial "modulation patterns". One simple pattern is a periodic set of parallel stripes, with each cycle showing a generally sinusoidal intensity pattern. A simple physical explanation is that the two RF pulses can have similar effects individually, but the gradient applied after the first pulse causes a spatially dependent phase factor associated with the first RF tagging pulse. Then, depending upon this phase factor, the two RF tagging pulses may "add constructively" or "cancel each other like a destructive interference". Thus, a series of stripes is generated, with bright untagged signal appearing at locations where the tagging pulses cancel each other, and with tagged reduced (dark) signal bands appearing in locations where the effects of the two RF tagging pulses combine together constructively.

It is known that spatial tagging lines may appear as pairs of minima under certain conditions, and that the spatial separation of the pair of minima could be used to determine B1. The conditions for favorable application of this acquisition method and analysis approach can include a total tagging excitation higher than 90° (perhaps between 110° and 270°), magnitude image reconstruction, and image pixel resolution of multiple pixels across each full spatial cycle of the complicated tagging pattern.

Suppose the two pulses each have some nominal amplitude at a particular location, each yielding (perhaps) 35° tip angle in some region. The tagging portion of the acquisition sequence can then be described as having a total tagging RF nutation angle of 70°, which dictates the percentage of signal suppression at a trough in that region.

If SPAMM acquisition is used with image-domain peak-and-trough detection method, significant error can arise if a neighboring peak and trough are used together in a ratio, but they have other confounding effects, like major differences in ρ.

The B1 and B0 fields are both perturbed by the presence of the patient/object in the image volume. Both are causes for MR pulse sequences performing non-ideally. Both can have bigger effects at higher field strength, i.e., more artifact at 3 T than 1.5 T usually.

The term "B0" is here used in the currently popular manner to include static field error from the scanner (e.g., the static magnet), susceptibility-based error from the patient or, even more loosely, to include chemical shift such as off-resonance of fat relative to water. That is, a map of B0 variation can describe the off-resonance amount of undesirable variation, without regard for the underlying sources of such error.

B0 maps can be presented in units such as ppm, or Hz, or unscaled, or even in units such as a fraction of the fat-water resonance shift. At 3 T with hydrogen MR, 1 ppm is about 128 Hz. Fat-water-shift is about 420 Hz or 3.3 ppm. Conversion between units can be freely accomplished.

Some examples of uses for B0 map data are:
Shimming
Validating or evaluating results of shimming
Identifying sources of image degradation (e.g., whether fat saturation procedures are progressively degrading or failing, to better identify which means might yield improvements, etc.)
Corrections in quantitative imaging (e.g., if some calculations are made to yield T1 maps)
Direct interpretation of underlying interesting physical quantities (e.g., temperature, concentrations of exogenous contrast media, etc.)
Corrections such as for spatial distortion and/or misregistration in echo planar imaging (EPI)
Corrections in fat-water imaging such as some more advanced "Dixon Method" variants.

One conventional method for creating a B0 map involves collecting field echo images, at two different TE values (i.e., other than for TE, the two MRI sequences should be identically matched). Then, the complex phase of each (x, y) image pixel is calculated and the phase differences are calculated:

PhaseDiff=PhaseImage(*TE*2)−PhaseImage(*TE*1).

This phase difference can be attributed to the extra time required for off-resonance (ΔF) terms to act, and the ΔF deviation may be easily determined from the phase difference image because:

PhaseDiff(*x,y*)=2π*(*TE*2−*TE*1)*Δ*F*(*x,y*).

Such phase differences may affect (or be affected by) many other sources of background phase, such as RX coil spatial phase pattern, some concomitant gradients, some eddy currents, some motion or flow effects, etc. Maps of the phase differences ΔF can be made for many different spatial imaging schemes, such as 2-D, 3-D, 2-D multislice, etc.

There are known practical advantages of subtracting two distinct images, two distinct acquisitions. Depending on "how sensitive" the acquisition is, one may see many phase wraps or only a few phase wraps in a phase map. This sensitivity comes basically from the choice of TE (if a single image is acquired), or else from the difference in TE (if two images are phase subtracted, sensitivity depends on TE2−TE1). For long TE field echo sensitivity (e.g., 15-30 msec), it may be sometimes permissible to count only the number of full cycles. For short TE field echo sensitivity (e.g., 2 msec), only the main value of phase map may be needed, which may not need any phase unwrapping at all. Methods of phase unwrapping and the relevance of phase unwrapping are well known in the art.

This application describes an improved way to determine spatial patterns and amplitudes of transmit RF B1 fields and/or static B0 fields in MRI systems. When used in conjunction with suitable MRI acquisition pulse sequences, measurements of patterns are produced which will depend both upon the design of the scanner and upon the subject. Thus, experimental measurement and determination on individual patients is more suitable than, say, theoretical calculations for a single patient or single geometric model. The technique can be especially advantageous at higher field strengths, in bodies and abdomens, or in cases where acquisition speed is important, or where motion in the body can make measurement problematic.

The current application describes an exemplary method for determining or calculating B1 or B0 maps, from experimentally acquired MR data of a suitable kind. In particular, advantages can be realized in accuracy or practical performance or speed when generating B1 or B0 maps, especially inside humans or moving, living subjects.

Sometimes transmit fields are denoted by Tx, or Tx B1, or the like, and because they can exhibit a certain polarity of circular polarization, they can also be denoted as $B1^+$. Similarly, receive RF fields associated with samples and coils can be denoted as Rx, or Rx B1, or $B1^-$, etc.

The exemplary embodiments to be described below generate a B1 map of RF B1 signal magnitude values in a MRI system by using an MRI system to:
acquire at least one two-dimensional set of B1 amplitude-tagged MRI data signals in spatial frequency domain k-space from MR nuclei within an imaged volume of the MRI system;
process such k-space data to produce at least two of three sub-sets of frequency-filtered k-space data (e.g., a baseline low frequency sub-set, and at least one of (a) a higher positive-frequency sub-set and (b) a higher negative-frequency sub-set, such higher frequency sub-sets including respectively corresponding harmonic versions of the baseline sub-set);
separately transforming each of these at least two filtered sub-sets to respectively corresponding spatial domain data sets (e.g., a baseline magnitude set, and at least one of (a) a positive harmonic magnitude set and (b) a negative harmonic magnitude set);
arithmetically combining the baseline magnitude set with the harmonic magnitude sets on a pixel-by-pixel basis to provide upper and lower magnitude envelope data sets;
processing the upper and lower magnitude envelope data set values on a pixel-by-pixel basis to generate a B1 map data value based on an inverse function (e.g., trigonometric in the exemplary embodiments where sinusoidal tagging is used) of a value related to a ratio of the upper and lower pixel data values at a given pixel location in the spatial domain; and
storing or displaying the B1 map data values for use in MRI system design and/or correcting/compensating diagnostic MR images taken by the MRI system (e.g., perhaps on a patient-by-patient basis).

Further exemplary embodiments to be described below, generate a B0 map of effective off-resonance values in a MRI system by using an MRI system to further:
process the image-domain phase associated with preferably at least one of the two sub-sets of higher frequency-filtered k-space data (e.g., at least one of (a) a higher positive-frequency sub-set, and (b) a higher negative-frequency sub-set), to yield a B0 map;

store or display the B0 map data values for use in MRI system design and/or correcting/compensating diagnostic MR images taken by the MRI system (e.g., perhaps on a patient-by-patient basis).

Preferably, the acquisition of k-space data from MR nuclei is achieved by applying at least two RF excitation pulses with at least one interleaved magnetic gradient pulse in a pre-sequence before applying an MRI pulse sequence (e.g., one of the many conventional well known MRI pulse sequences) to elicit successive MR responses in the time domain which are then mapped to respectively corresponding positions of k-space (e.g., typically to provide successive, respectively corresponding, lines of a multi-dimensional set of k-space data in a spatial frequency domain.)

There are also advantages to be had if the original k-space data set is (a) two-dimensionally Fourier transformed to the spatial domain, and (b) further two-dimensionally Fourier transformed back to the spatial frequency domain k-space before further processing. This detour to the spatial domain and back again to k-space has been discovered to provide advantages in that it may produce a more idealized k-space data set for B1 mapping purposes. For example, if the MRI system happens to use multiple receiver coils with outputs that are combined to achieve complete data acquisition and/or uses parallel imaging techniques and/or uses complex-conjugate filling of a part of a k-space, etc., then experience has shown that a more idealized "starting" k-space data set (for B1 mapping) results from detouring into the spatial domain and back again into the spatial frequency domain.

The spatial-tagging pre-pulse sequence may also be of many different types. For example, there are well known tagging sequences such as the SPAMM (spatial modulation of magnetization) sequence and/or the DANTE (delays alternating with nutation for tailored excitation) sequence. Such tagging sequences can produce sinusoidally varying spatial modulation which permits trigonometric inverse functions to be used as in the exemplary embodiments. Other tagging sequences may produce non-sinusoidal modulation, thus necessitating use of alternate inverse functions.

The acquisition of a "starting" k-space data set may also involve multiple data acquisition cycles and combining of the resulting k-space data. For example, it has been found particularly suitable to acquire a first set of k-space data using a first tagging pre-sequence of at least two RF excitation pulses having the same sense of nutation angle and then also acquiring a second set of k-space data using a second tagging sequence of at least two RF excitation pulses having different, alternating nutation angle senses. The two sets of thus acquired k-space data are then arithmetically combined to produce a combined set of k-space data to be used as a "starting" k-space data set in subsequent steps of an exemplary embodiment. As will be explained in more detail below, this multiple acquisition and combination of k-space data can itself result in favorable reduction of harmonic content for the "starting" k-space data set to be used thereafter in an exemplary B1 mapping process.

Once a suitable "starting" k-space data set has been acquired (which may be a single first-acquisition k-space data set without detours or further preliminary processing), then it is spatial frequency-filtered in k-space by extracting k-space data from different portions of the k-space spatial frequency data set. In particular, the baseline low frequency sub-set of k-space is extracted, as well as at least one higher frequency harmonic-containing portion of k-space data (e.g., extracted from two other adjoining areas of k-space such as a strip of k-space located above the baseline strip and a strip of data located below the baseline in k-space). The extraction may be made with respect to strips or rectangular/square (or other shaped) windows in k-space (possibly having sharp or weight-shaped edges) so as to, in effect, perform a frequency-filtering function since the k-space data is already in the spatial frequency domain.

The frequency-filtered k-space extract data is then two-dimensionally Fourier transformed so as to bring it to the spatial domain—thus providing at least two sets of spatial domain data—where by using only magnitude values for each data point, one can effectively de-modulate the harmonic higher frequency data and be left with "envelope"-defining sets of values—one representing a low-frequency component and one representing higher frequency, demodulated components (e.g., located above (and/or below) the baseline component in k-space).

If the magnitude values from all sets of resulting spatial domain data are added on a pixel-by-pixel basis, this provides a map of the peak or "upper" signal magnitude envelope. Similarly, subtracting from the baseline magnitude set, on a pixel-by-pixel basis, the harmonic magnitude set(s) provides a map of trough or "lower" signal magnitude envelope values.

Once such minimum and maximum pixel values have been determined, then a "tag depth" ratio data set may be created on a pixel-by-pixel basis where, for example, each pixel is assigned a value of tag depth ratio data TD=min/max where min is the lower magnitude data set value and max is the upper magnitude data set value. One may then calculate the arccos of the tag depth ratio values ($\cos^{-1}$ TD) on a pixel-by-pixel basis so as to provide a B1 map of effective tag nutation flip angles θ. Of course, once the effective nutation flip angles θ are known, then the corresponding B1 magnetic field strengths may be calculated based on known formulae to provide a B1 map of effective B1 magnetic field strengths. Either the B1 map of effective nutation flip angles θ or the B1 map of effective field strengths B1 may, of course, be normalized by ratioing such values with the nominal desired value of θ or B1 provide a map of normalized B1 field strengths and/or flip angles θ.

Any of these types of B1 maps may, of course, be displayed on a screen or printer for visual observation/use (e.g., in designing MRI system changes and/or quantifying MRI images, "correcting" or "compensating" such MRI images, etc.).

Some advantages of this exemplary embodiment are:
Compared to image-domain detection of peaks-and-troughs with tagged data, the exemplary processes reduce or remove errors from unequal baseline signals being used within a single ratio, and in a single determination of B1 in a region.
The exemplary processes remove the need to fit the local pixel data to determine the actual height of a peak, (or the actual minima of a trough) when the location of the peak (or trough) is not centered on a pixel. If uncorrected, this would normally lead to underestimation of the signal level difference between peaks and troughs and, therefore, would lead to a bias towards underestimating the B1 level and the flip angle θ.
The exemplary processes remove the bias which could arise when there is partial averaging of the tagging spatial profile within a pixel of finite extent.
The exemplary processes are amenable to true single-shot readout, as a way to get rid of inconsistencies from human motion (e.g., temporal resolution of much less than 100 msecs can be obtained).

The exemplary processes can be easily used in a breath-hold, to gain immunity against respiratory motion artifacts.

Since the main acquisition method can be changed to use various pulse sequences, there can be a wide range of resolution and sensitivity to MRI parameters, i.e., it is possible to choose a sequence with higher spatial resolution, or better sensitivity, or reduced sensitivity to motion.

The exemplary processes can be used in the presence of diverse tissue types, including fat.

The exemplary processes can be fully automated, and do not require secondary inputs such as T1 maps, or off resonance maps, or estimates of T2 or T2*.

The exemplary processes have high dynamic range, even without extending the usable signal analysis range beyond 90° total tagging angle. For example, one acquisition can capture a range of flip angles from 20° to 80°, i.e., a dynamic range of 4-to-1.

The exemplary processes have high immunity to noisy images, as a result of good filtering.

The exemplary processes have the ability to get good spatial resolution, if desired (maps of 32×32 or less are not unusual with some other methods).

The exemplary processes allow higher resolution, in terms of tag lines being potentially closer together, than in image-domain-based analysis of the tag lines. Note that the filtering step, or the step of generating an envelope of the modulation part, will generally introduce a blurring or loss of resolution in the B1 map, which is on the order of the spacing of the tag lines. Thus, closer tag line spacing, such as three pixels per tagging profile cycle, as opposed to, say, 5-10 pixels per cycle, can yield a higher resolution B1 map.

The goals addressed herein include providing a method to generate quick B1 and B0 maps for all human anatomies, phantoms, all coils, etc. SPAMM tagging generates nominally regularly spaced tag lines as saturations or inversions. In a partial saturation case using 1-1 binomial RF pulses, the tag spatial profile is sinusoidal. The amplitude of saturation depends on the RF nutation or tip angle of the SPAMM tagging pulses. In an inversion case, different tagging appearance is provided where the spacing of doublet lines depends on the RF tip angle of the tagging pulses. The PhaseDiff image may have successive bands or rings which can be "unwrapped" to provide a continuous and unambiguous trace of phase difference changes. That is, in effect, there may be an additional step of "counting the rings" to determine how many extra complete cycles of phase are involved. For example, an x, y, z pixel with a nominal 40 degrees phase difference in the map might actually be located in a region between the second and third set of "rings" or "bands", so that the true accumulated phase difference could be (2*360)+40=760. This process is generally referred to as "phase unwrapping" and is well known in the art.

Largely the same processing and data acquisition as used for B1 mapping may be used to generate not only a B1 map, but also a B0 map.

The described processing herein for B1 mapping separates out some k-space data from different spatial frequency regions (e.g., windowed areas in k-space) having similarities (e.g., harmonic content). One apt descriptive term here adopted for the signals residing in such portions of k-space is "replicants". Such replicants are used to determine the amplitude associated with the modulated (i.e., tagged) part of an image. In the B1 mapping process, the magnitudes and ratios of magnitudes are used to infer the amount of tagging, and hence the strength of the B1 fields which generated the tagged data.

It has now been discovered that an enhancement can also yield B0 maps. In particular, the B1 mapping process uses "windowed" replicants (e.g., taken from a central k-space lobe, a right-side k-space lobe and a left-side k-space lobe).

Now the same k-space replicants (lobes) can be used to produce a B0 map. For example, a 2DFT of the central lobe is calculated and a 2DFT of the right and/or left lobe(s) (when effectively shifted to the center of k-space) can be calculated to produce two spatial domain images of complex-valued pixels. Thereafter, there are several optional ways to calculate B0 on a pixel-by-pixel basis:

(1a) take complex phase of central lobe and subtract it from complex phase of shifted right lobe; or (1b) use subtracted replicant phase, $\phi_{total} = (\phi_{right\ lobe} - \Phi_{left\ lobe})/2$; and (2) convert phase to $\Delta F$, which is proportional to $\Delta B0$.

If the k-space data used in this process was derived by back-transforming ($2DFT^{-1}$) of a magnitude image, then there is no advantage to using both right and left lobe replicants because they would contain identical information. However, if the originally acquired complex k-space data is used, the right and left lobes may vary, and combining data from both lobes and stripping off phase data from the central lobe may offer a possible improvement in S/N ratio and/or in artifact removal.

To describe the B0 map generation in a more mathematical notation, a series of values can be generated in succession, which for convenience are simply named S1, S2, S3, etc.

Suppose the untagged image is represented in the image domain as $$S1 = M^* \exp(i\psi)$$

where M is the real-valued magnitude as a function of position, i.e., M(x,y) and where $\psi$ is a real-valued phase term, also a function of position, i.e., $\psi(x,y)$.

Then represent the corresponding k-space values as $$S2 = F(S1) = m^* \exp(i\phi)$$

where m and $\phi$ are functions of $(k_x, k_y)$, and where F represents a Fourier transform, such as a 2-dimensional discrete Fourier transform.

Then, with a spatial tagging profile $$P = (1-f) + f^* \cos(\theta)$$

use the accumulated phase between the two RF pulses of the SPAMM pre-pulse $$\theta = k_x^* x + \text{gamma}^* \Delta B0^* t$$

where $\Delta B0$ is the spatially varying off-resonance, where f is the spatially varying tag depth, where t is time separation between the centers of the square RF pulses, and where gamma is the gyromagnetic ratio. Here, the term $(k_x^* x)$ shows the evolution of phase explicitly due to the SPAMM pre-pulse gradient lobe between the SPAMM RF pulses. The term (gamma*$\Delta B0$*t) shows other sources of phase accrual, which may be thought of as off-resonance, as background B0 terms, as susceptibility terms, and the like. We need to solve for $\Delta B0$, at least approximately.

Use the standard mathematical formula $$\cos(\theta) = (\exp(i\theta) + \exp(-i\theta))/2$$

to write the tagged image $$S3 = P*S1,$$

as $$S3 = M\exp(i\phi)((1-f) +$$

$$f/2*\exp(i(k_x*x + \text{gamma } \Delta B0 t)) +$$

$$f/2*\exp(-i(k_x*x + \text{gamma } \Delta B0 t))).$$

Then the k-space of the partially saturated tagged image is $$S4 = F(S3).$$

Assuming that the Fourier transforms of $M\exp(i\phi)$, $f$ and $(\Delta B0\, t\,\gamma)$ are all functions that have their signal energy tightly localized near the center of k-space, then we have the three windowed regions of k-space $$S5 = \text{left window}(S4)$$

$$S6 = \text{center window}(S4)$$

$$S7 = \text{right window}(S4)$$

which are approximately equal to $$S5 \approx (m*\exp(i\phi)) \# (F(f/2)) \# (F(\exp(i(k_x x + \text{gamma } \Delta B0 t))))$$

$$S6 \approx (m*\exp(i\phi)) \# (F(i-f))$$

$$S7 \approx (m*\exp(i\phi)) \# (F(f/2)) \# (F(\exp(-i(k_x x + \text{gamma } \Delta B0 t))))$$

where # indicates the convolution operation.

Next, shift the left windowed and right windowed parts of k-space:

$$S8 = \text{shift}(S5)$$

$$S8 \approx (m*\exp(i\phi)) \# (F(f/2)) \# (F(\exp(i \text{ gamma } \Delta B0\ t)))$$

$$S9 = \text{shift}(S7)$$

$$S9 \approx (m*\exp(i\phi)) \# (F(f/2)) \# (F(\exp(-i \text{ gamma } \Delta B0\ t))).$$

Next, perform a Fourier transform, such as an inverse 2-D discrete Fourier transform, on the shifted windowed k-space parts $$S10 = F(S8)$$

$$S10 \approx M \exp(i\psi)*f/2*\exp(i \text{ gamma } \Delta B0\ t)$$

$$S11 = F(S9)$$

$$S11 \approx M \exp(i\psi)*f/2*\exp(-i \text{ gamma } \Delta B0\ t).$$

Next, take the phase angles of these complex images $$S12 = \arg(S10)$$

$$S12 \approx \psi + \text{gamma } \Delta B0\ t$$

$$S13 = \arg(S11)$$

$$S13 \approx \psi - \text{gamma } \Delta B0\ t.$$

Finally, take the difference of the phase maps, and solve for $\Delta B0$ $$S14 = S13 - S12$$

$$S14 \approx 2\Delta B0\ t\ \gamma$$

$$\Delta B0 = S14/(2 \text{ gamma } t).$$

The MRI system shown in FIG. 1 includes a gantry 10 (shown in schematic cross-section) and various related system components 20 interfaced therewith. At least the gantry 10 is typically located in a shielded room. One MRI system geometry depicted in FIG. 1 includes a substantially coaxial cylindrical arrangement of the static field B0 magnet 12, a $G_x$, $G_y$, and $G_z$ gradient coil set 14 and an RF coil assembly 16. Along the horizontal axis of this cylindrical array of elements is an imaging volume 18 shown as substantially encompassing the head of a patient 9 supported by a patient table 11.

An MRI system controller 22 has input/output ports connected to display 24, keyboard 26 and printer 28. As will be appreciated, the display 24 may be of the touch-screen variety so that it provides control inputs as well.

The MRI system controller 22 interfaces with MRI sequence controller 30 which, in turn, controls the $G_x$, $G_y$ and $G_z$ gradient coil drivers 32, as well as the RF transmitter 34 and the transmit/receive switch 36 (if the same RF coil is used for both transmission and reception). The MRI sequence controller 30 includes suitable program code structure 38 for implementing a spatial-modulation pre-sequence (e.g., SPAMM or DANTE) in conjunction with other (e.g., conventional) MRI sequences already available in the repertoire of the MRI sequence controller 30.

The MRI system 20 includes an RF receiver 40 providing input to data processor 42 so as to create processed image data to display 24. The MRI data processor 42 is also configured for access to a B1 and/or B0 map program code structure 44 and to a B1 and/or B0 map memory 46 (e.g., for storing B1 and/or B0 map data derived from processing in accordance with the exemplary embodiments and the B1 and/or B0 map program code structure 44).

Also illustrated in FIG. 1 is a generalized depiction of an MRI system program store 50 where stored program code structures (e.g., for B1 and/or B0 mapping based on spatial frequency domain analysis) are stored in computer-readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those in the art will appreciate, the FIG. 1 depiction is a very high level simplified diagram of a typical MRI system with some modifications so as to practice exemplary embodiments to be described hereinbelow. The system components can be divided into different logical collections of "boxes" and typically comprise numerous digital signal processors (DSP), microprocessors, special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of a B1 and/or B0 mapping process, an array of computer-readable accessible data value storage sites in physical storage media will be transformed from some prior state (e.g., all uniform "zero"

values or all "one" values) to a new state wherein the physical states at the physical sites of such an array vary between minimum and maximum values to represent real world physical events and conditions (e.g., the sensitivity map for an RF antenna/coil over an imaging volume space). As those in the art will appreciate, such arrays of stored data values represent and also constitute a physical structure—as does a particular structure of computer control program codes which, when sequentially loaded into instruction registers and executed by one or more CPUs of the MRI system 20, cause a particular sequence of operational states to occur and be transitioned through within the MRI system.

The exemplary embodiments described below are superior ways to process acquisitions and compute B1 and/or B0 maps from images which have intensity modulation from tagging pulses.

The acquired single image has a spatial modulation imposed on it. The basic spatial frequency of the modulation is known, to within lesser variations which arise from B0. The amplitude of the modulation depends upon the strength of RF pulses and hence the spatial B1 (transmit field) dependency. Raw MR data (k-space data) for these scans includes a central section which generates the unmodulated (i.e., low-frequency base band) part of the image.

In a preferred embodiment, the k-space data is reconstructed to an image in the spatial domain in the usual way, including an (inverse) 2DFT and taking the magnitude of the complex image. A further (forward) 2DFT is then used to convert it back to the k-space spatial frequency domain which contains shifted replicas which generate the higher frequency modulated components of the image. Simple windowing operations separate the modulated and unmodulated components (in k-space). The k-space data includes a "low-pass" unmodulated part of the signal, a "high-pass" modulated part with a positive spatial frequency, and a "high-pass" modulated part with a negative spatial frequency. Each of the parts (the two modulated parts and the unmodulated part) are then independently transformed back to the image domain. Taking the magnitude (in the image domain) of complex quantities demodulates the modulated parts. One might choose to call these contributions "modulated-unmodulated" parts. Sums and differences of those parts, in turn, give robust maps of the maximal signal envelope and minimal signal envelope. The unmodulated part plus the modulated-unmodulated parts gives the peak envelope. The unmodulated part, minus the modulated-unmodulated parts gives the trough envelope. These generated envelopes are more accurate than quantifying peaks and valleys in the image domain. The technique is fast enough to be acceptable for calibrations or pre-scans, if needed, in clinical scanning applications.

The filtering in k-space can be done by multiplying the data by, for example, two, three (or more) window functions. A first window, for the low-pass, can be positioned over the center of k-space, i.e., the D.C. component. Alternately, it is feasible to search the k-space data to detect the location with the highest peak, and to use that as the center for the low-pass window.

The locations at which to apply the at least one high-pass window (e.g., two in this exemplary embodiment, one for positive and one for negative spatial frequencies, respectively) can be determined in any of a few ways. The area of the gradient pulse used between the two RF tagging pulses can be multiplied by a Larmor frequency, to give a k-space distance, in units such as cycles per centimeter. This distance, plus knowledge of the imaging field of view, can be used to determine a distance in terms of a number of samples (presuming for example, critical Nyquist sampling rates). As an example, if the gradient area resulted in a cycle of accumulated phase every 6 millimeters, and if the imaging field-of-view were 24 centimeters, then the modulation amounts to 40 cycles of modulation across the image. Thus, by the Fourier shift principle, the modulated parts will be displaced by 40 samples to either side of the unmodulated low-pass central data. Therefore, one may multiply one copy of the k-space data by a window shifted 40 indices to one direction, and multiply another copy of the k-space data by an identical window shape, but displaced 40 indices in the opposite direction from the center. The particular window functions could be any of a wide set of shapes, such as Hanning, Hamming, Gaussian, Kaiser-Blackman, Fermi functions, etc., as are well known in signal processing and in MRI. An alternative to calculating the shift from gradient and sequence parameters is to search the k-space data to detect the location of these secondary peaks.

The windowing operations in k-space provide a kind of filtering and reduce noise, allowing better determination of peak and trough signal. But a more significant advantage arises from the fact that the unmodulated-modulated image-domain data and the low-pass unmodulated data now have their minor oscillations removed, and have meaningful values at all pixels. Areas with no signal will have values near zero. Thus, it is possible to form a ratio of two components at the same pixel. At a pixel which previously would have been a trough, there is now what amounts to an interpolated or fitted value which gives a reasonable estimated value of a peak at the same location. At a pixel which previously would have only been a peak, there is likewise an available estimate of a trough. And in between, there are high-quality fits to both peaks and troughs. Thus, the main source of error is removed, which used to arrive from changes in tissue signal as one moved from a peak location to a trough location. This greatly improves the quality of the B1 map in areas where the MRI tissue characteristics change.

On a pixel-by-pixel basis, the next step is to form a ratio of the minimal signal to the maximal signal. This ratio can be called the "tag depth" where a value approaching zero indicates near complete darkening (saturation) by the total tagging RF angle. The total tagging RF angle is then determined by taking the inverse cosine (arc cos) or $\cos^{-1}$ of the tag depth TD=min/max. When the min is close to the max, TD is just less than one, and the tagging has minimal effect. When min is close to zero, then TD is also small which indicates the efficacy of the imposed tagging is close to 100% saturation.

Optionally, alternative measures might be generated for storage or display. For example, a "tagging efficiency" defined as (1-min/max) might be favorable for ease of human comprehension, as a value near 1.0 would then represent highly effective tagging saturation and 0.0 would be completely ineffective tagging.

The B1 field can be saved in any of a few representations. It is reasonable to express the value at each pixel as the magnetic field strength of the effective transmit RF field. Alternately, it is reasonable to show the flip angle of a particular pulse, or the total tagging RF pulse.

Another favorable representation of the B1 map is to form a ratio, giving the actual local value normalized by the nominal value specified in the sequence. This ratio could be formed between tip angles, or between B1 field strengths, etc. In such a representation, a value over 1.0 would indicate "over-tipping"; 1.0 is the ideal value, and values under 1.0 indicate under-tipping. Such a representation can be useful because it includes not just the spatial variation of the B1 Tx field, but it also captures any effects of calibration or system gain errors.

It characterizes the entire MR system transmit RF, including possible deviations in calibration, transmitter gain, etc.

Within reason, the time from the tagging to the excitation pulse should be kept short, especially compared to the T1 values of the materials, to minimize a source of bias, where T1 relaxation of the tagged nuclei could cause their amplitude to be under-estimated, and the B1 value also underestimated. Similarly, the duration of each individual tagging pulse should be kept short, as otherwise off-resonance during a pulse can lead to different effective tip angles. In particular, off-resonance can introduce a bias, and underestimating of the RF pulse angle and the B1.

Figure 2:
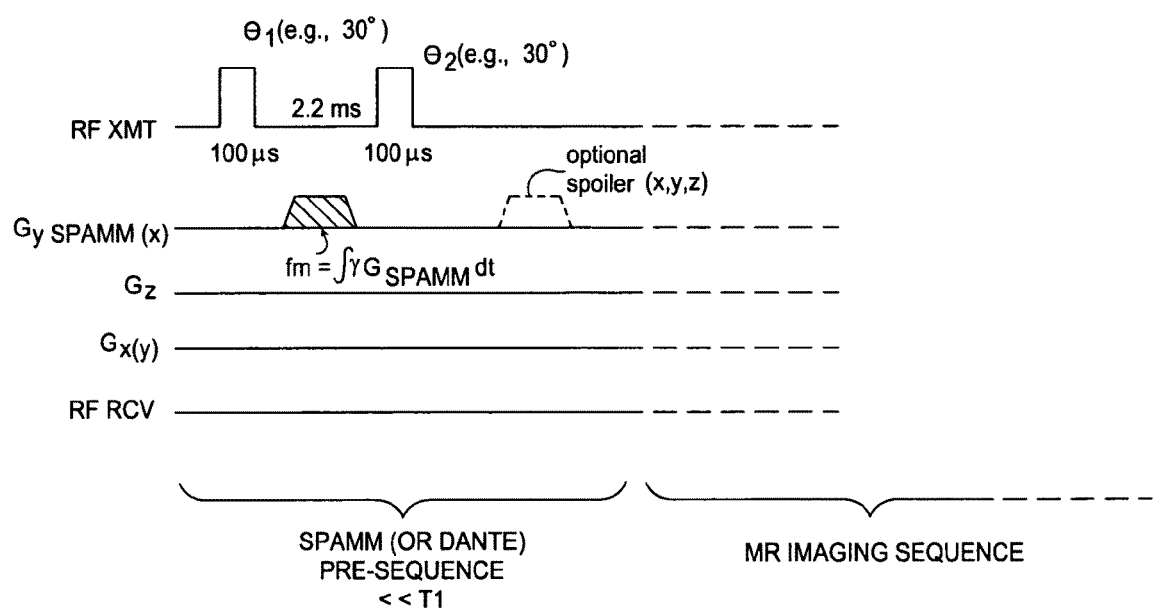
FIG. 2 is a schematic depiction of a pre-sequence to be employed in conjunction with a following MR imaging sequence so as to acquire spatially-tagged k-space data for use in the exemplary embodiments.

A typical data acquisition sequence is depicted at FIG. 2 where a SPAMM pre-sequence precedes a conventional MR imaging sequence. Here, in this particular example, two 30° RF nutation pulses are transmitted into the imaging volume and between them, a SPAMM magnetic gradient pulse is interleaved. The spatial modulating frequency will be proportional to the integral of the tagging gradient. An optional spoiler pulse may also be employed after the pre-sequence and before the conventional MR imaging sequence begins. As will be appreciated, the received RF signals occur later during the conventional MR imaging sequence. However, they will have been spatially modulated because of the pre-sequence depicted at FIG. 2. In the example of FIG. 2, the SPAMM spatial encoding (i.e., "tagging") gradient pulse is imposed by using $G_y$ (typically the phase encoding gradient in a conventional MR imaging sequence), although it could also be imposed via the $G_x$ gradient (which is shown in parenthesis in FIG. 2). The optional spoiler pulse could be provided by any of $G_x$, $G_y$, or $G_z$. Typically, $G_z$ is used as the "slice-select" gradient during subsequent RF excitation pulses in a conventional MR imaging sequence, while $G_x$ is applied during read-out of, for example, an RF echo response in the time domain so as to frequency encode the read-out RF signals in the x spatial dimension.

Figure 3:
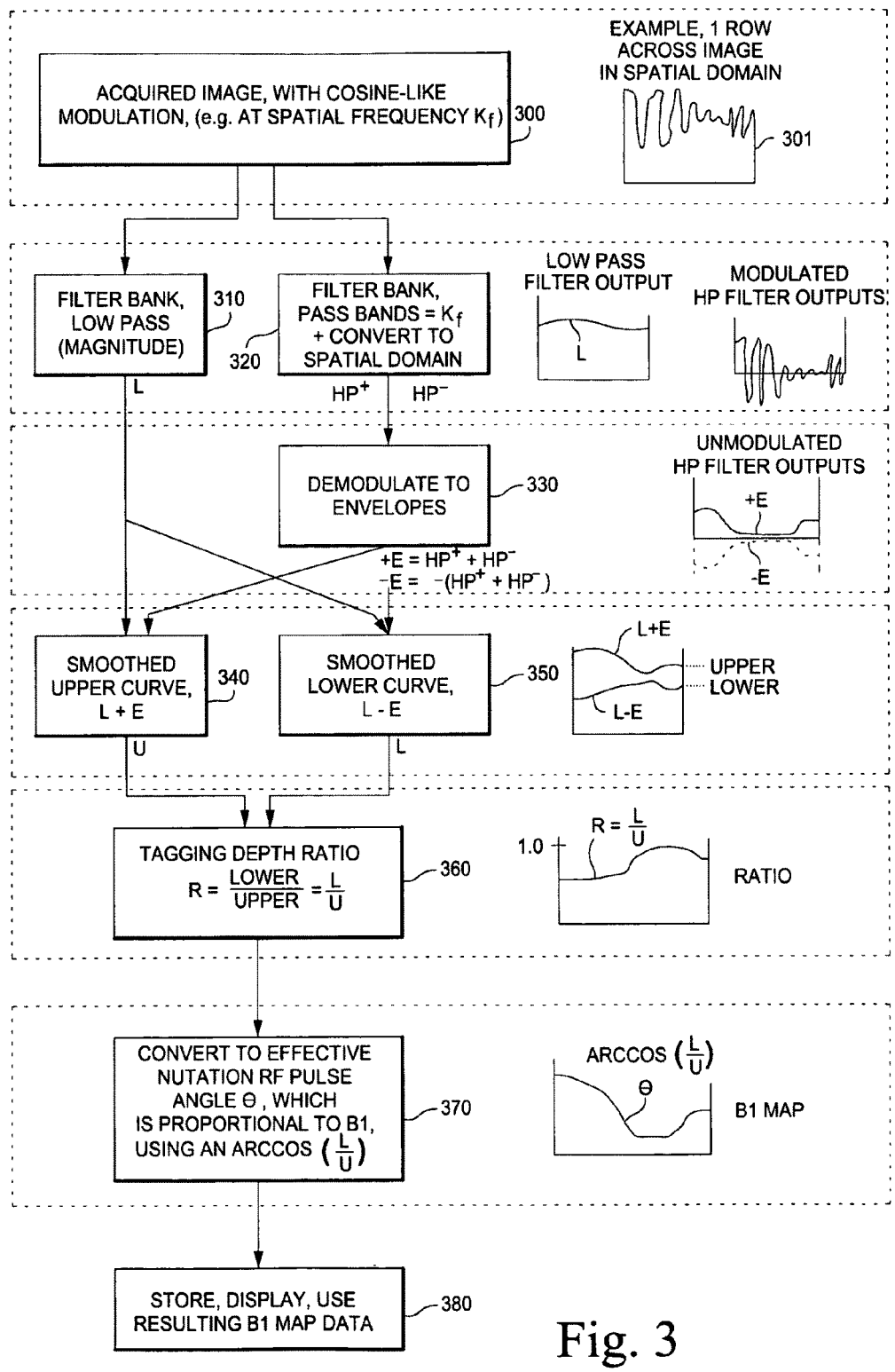
FIG. 3 is a schematic diagram, at a relatively high level, of exemplary processes utilized in the exemplary embodiments for B1 mapping in an MRI system using k-space spatial frequency domain filtering.

A high level schematic depiction of an exemplary process is provided at FIG. 3. Here, at 300, k-space MR image data is acquired with cosine-like spatial modulation (e.g., at a spatial frequency $k_f$ that is determined by the tagging gradient used during the pre-sequence as noted above).

As earlier indicated, some advantages can be had by twice two-dimensionally Fourier transforming the originally acquired k-space data so as to create a processed "starting" k-space data set before frequency filtering operations are performed in accordance with this embodiment.

As depicted on the right side of FIG. 3 at 301, one row of k-spaced data in the spatial domain will have superimposed modulation at a spatial frequency $k_f$.

The "starting" k-space data set is then frequency filtered at 310, 320 and converted to the spatial domain (e.g., by 2DFT). The filter bank 310 is a low-pass filter providing magnitude output L, while the filter bank 320 is a high-passband filter with passbands located above and below the low-pass filter bank at $+-k_f$. (The high-pass filter could alternately be a bandpass filter, with a passband centered near the nominal SPAMM spatial modulation frequency. In subsequent references to "high-pass", it is recognized that either high-pass or bandpass implementations can be used, and the intent is to include both cases.) The filtered higher passband spatial domain data sets (e.g., based on harmonics of the base band signal) are then demodulated at 330 (e.g., by taking absolute values of complex values) to provide a pair of higher frequency envelopes +E and −E. Rough schematic depictions of an exemplary one row of data across the image in the spatial domain are depicted to the right in FIG. 3 for each of these outputs.

At 340, a smoothed "upper" curve (L+E) is derived, while at 350, a smoothed "lower" curve (L−E) is derived. Once again, a depiction of one row of data across the image in the spatial domain is shown to the right side of FIG. 3.

At 360, a "tagging depth" ratio R can be calculated at each pixel by taking a ratio between the "lower" and "upper" data magnitude values. This ratio can then be converted at 370 to an effective nutation RF pulse angle θ (which is proportional to B1 magnetic field strength) by using an inverse trigonometric function. For example, the quantity L/U can be used in conjunction with the arccos function so as to compute θ. Of course, as will be appreciated, θ can be converted to B1 magnetic field strength and either or both θ, B1 values can be normalized with respect to the nominal expected control values used for the original pre-pulse nutation modulation.

Finally, at 380, the resulting θ, B1 map data can be displayed, stored in machine-readable accessible storage media, or otherwise used (e.g., by retrieving it from storage data) to compensate a diagnostic image—perhaps for the very same patient anatomy that was in place during the derivation of the B1 map data.

Figure 4:
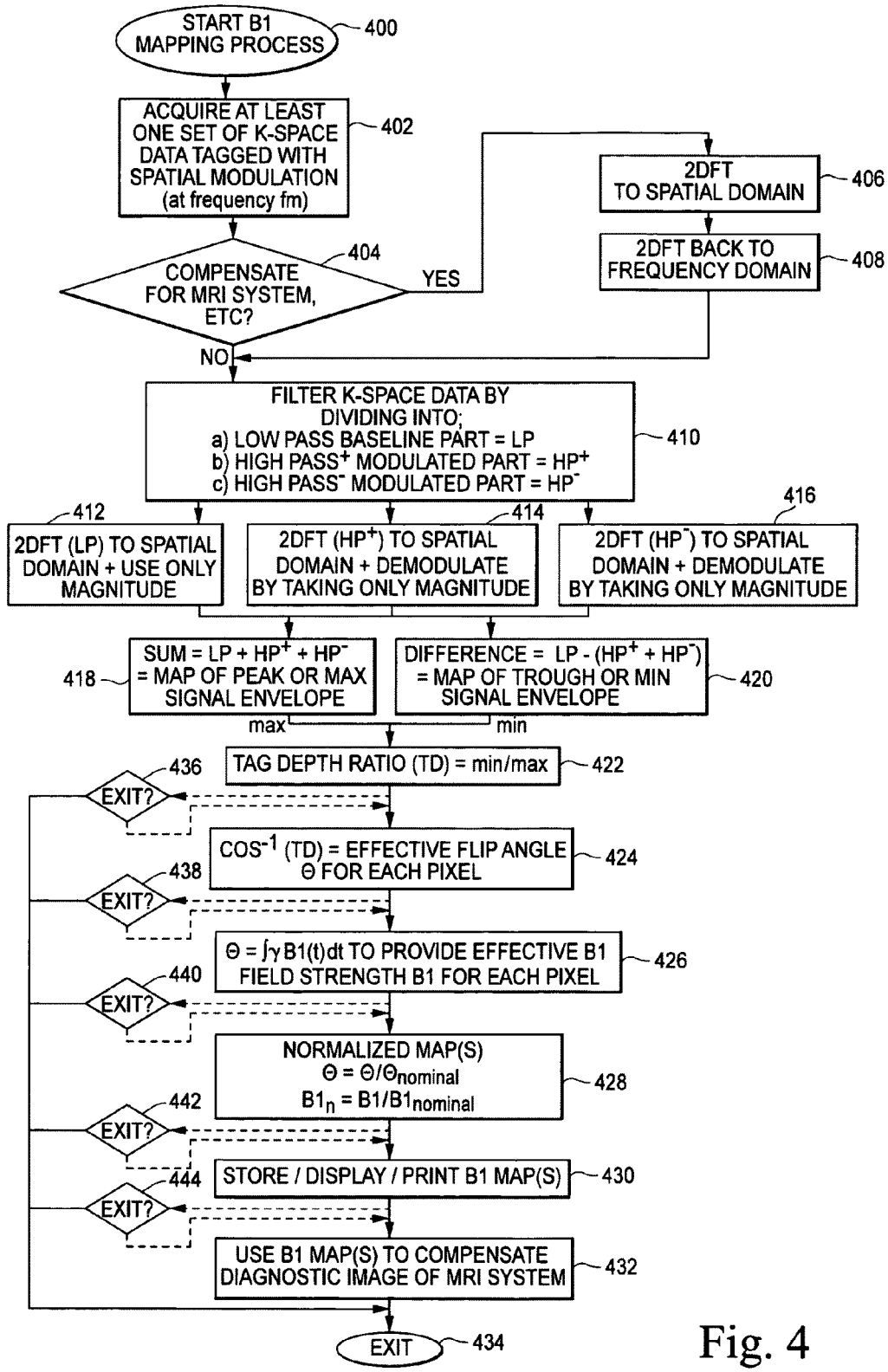
FIG. 4 is a more detailed schematic flowchart of process control program code structure that may be utilized in an exemplary embodiment of the MRI system shown in FIG. 1.

A more detailed program code structure is depicted at FIG. 4 for the MRI system of FIG. 1. Here, if a B1 mapping process is chosen, the process is initiated at 400. Thereafter, at least one set of k-space data tagged with spatial modulation is acquired at 402. For example, it may be acquired with a known spatial modulation frequency $f_m$. Although various sizes of k-space data arrays may be used (e.g., 32×32, 64×64, 128×128, etc.), for a hypothetical example, it may be assumed that $f_m$ is equal to one cycle every 2 cm or 0.5 cm$^{-1}$. Let it also be assumed that the k-space array is a 128×128 point array covering a square 256 mm slice of the imaging volume. This equates to an approximately 0.2 cm per pixel resolution, meaning that there are about five line-pairs of spatial modulation per centimeter, and a total distance of about 12.8 k-space data points between harmonics of the base band signal appearing at the origin of k-space (i.e., $k_x$=0 and $k_y$=0 at the center of k-space). In this example, then a base band strip of k-space approximately twelve lines wide and centered upon the middle "zero" line would constitute the baseline low frequency filtered portion of k-space. A similarly sized strip just above the baseline strip of about twelve lines wide would then constitute the high-pass "positive" filtered segment of k-space, while a similar twelve line segment or strip located just below the baseline across k-space would constitute the high-pass "negative" frequency filter passband.

As those in the art will appreciate, the variables could otherwise be chosen such that the entirety of k-space would simply be divided into thirds with the middle third being the base band low-pass frequency component and the upper and lower thirds being the positive and negative high-pass filtered components, respectively. When k-space is evenly divided in this manner, it facilitates the design of the transition bands of the high-pass and low-pass filters, as will be appreciated by those in the art.

If desired, at 404, a decision point may be inserted as to whether or not one wishes to compensate for MRI system variables by performing a first two-dimensional Fourier transform of the original k-space data at 406 into the spatial domain and then a second two-dimensional Fourier transforming from the spatial domain back to the frequency domain at 408 before arriving at a suitable "starting" k-space data set. Of course, as those in the art will appreciate, this may be done automatically all the time or never rather than to provide a user-controlled decision point 404.

The appropriate desired "starting" k-space data is then frequency filtered by dividing it into at least three portions (in this exemplary embodiment): a low-pass baseline part=LP, a high-pass positive modulated part=HP+ and a high-pass negative modulated part=HP−.

Each of the frequency filters (e.g., extracted parts) of k-space data are then two-dimensionally Fourier transformed so as to convert them back to the spatial domain—and demodulated by using only the magnitude of the spatial domain values at 412, 414 and 416, respectively.

Thereafter, on a pixel-by-pixel basis, all three of the filtered sub-sets are summed at 418 to provide a map of peak or maximum signal envelope values. At 420, a difference is taken between the low-pass baseline magnitude values and the sum of the high-pass side bands so as to provide a pixel-by-pixel map of the trough or minimum signal envelope values.

Thereafter, at 422, on a pixel-by-pixel basis, a tagged depth value is calculated which, in this exemplary embodiment designed for use ultimately with an arccos function, is calculated at min/max. As will be appreciated, at each pixel, this value then involves taking the ratio of the minimum to maximum values.

Thereafter, in this exemplary embodiment, at 424, the arccos of the tagged depth value is calculated for each pixel so as to derive an effective RF flip pulse angle θ for each pixel, thus providing a map of flip angle θ values. If desired, the θ values may be converted to B1 magnetic field strength values at 426 using well known formulae.

In addition, if desired, normalized θ and/or B1 map values can be generated at 428. Any or all of such θ, B1 map values are then stored and/or displayed and/or printed at 430 as may be desired. Such map values can also be used at 432 so as to compensate diagnostic images from the MRI system (perhaps from the very same patient that was used to generate the B1 maps) and/or to design improvements to the MRI system and the like, as will be appreciated by those in the art. Exit from this routine is taken at 434 and, as schematically depicted in FIG. 4, the program code structure may be configured with optional exits (or jumps to a desired type of mapping) at many desired points (e.g., at 436, 438, 440, 442 or 444).

Some enhancements (enumerated as 1-15E below) can provide optimizations of the acquisition pulse sequence, as ways to enhance the overall performance of B1 mapping. In narrow terms, the exemplary embodiment is mainly a processing and analysis process. But in broader terms, the overall method can be improved in some cases, by coupling the processing with an enhanced acquisition, and that acquisition enhancement may not have special significance outside its use with the exemplary embodiments desired herein.

Enhancement 1: Higher harmonic terms may be used to fit more complicated modulations. This can extend the dynamic range of RF tagging pulse amplitudes, beyond the sinusoidal patterns associated with magnitude image reconstruction and tags of less than 90° RF amplitude. Different tag line patterns are shown in the Bernstein, King and Zhou book. For example, to extend dynamic range of tagging pulses, one could characterize the tagging shape, by showing how the first two, three or four Fourier components of the modulation pattern are expected to vary with the total tag RF angle. Then, one can window and reconstruct multiple harmonics independently, and finally one can select the tagging angle which has the expected ratio of components which most closely match the data at a pixel.

Enhancement 2: The time shift between the component RF pulses inside SPAMM-like tagging pre-pulse can be constrained, so that the shift of the tag lines for the off-resonance difference between fat and water is substantially a multiple of the time period needed for one cycle of phase to accrue between these species. For example, at 3 T, the tagging pre-pulse could be generated by two pulses, timed such that the delay from the center of one pulse to the center of the next pulse is about 2.3 milliseconds. This time increment is known in other MRI pulse sequences as a "fat-water in-phase echo time". The reason to do such is so that the location of stripes in fat and stripes in water signal are the same, and fractional shifts of the RF tagging pattern are not encountered when crossing a fat-water interface. This makes the filtering and separation of the modulated component more robust.

Enhancement 3: If an echo train-based readout technique [EPI, FSE, FASE] is applied after the tagging, the effects of amplitude decay modulation of the echo train must be considered. The effect of the amplitude decay should be identical in each replicant. Otherwise, if different signal components were centered at different parts of the amplitude decay, then the different replicants would have different T2 decay, and their amplitudes could not be directly used in ratios, without error or biases. Therefore, the shift direction of the replicants should occur along the readout direction in k-space.

Enhancement 4: The filtering of the k-space data as described is along one direction. The resultant B1 map will have its spatial resolution limited in that direction. However, in the opposite direction within the image, higher spatial resolution may be obtained. Filtering can involve collecting and merging in two directions—one of which achieves good resolution near a horizontal edge direction, and the other of which achieves good resolution near a vertical edge direction.

Enhancement 5: If two excitations are desired without waiting for full recovery, this might be done by collecting them with different spacing tag orientation shifted 90° (or tag spacing shifted). While the first set of tags may not have fully recovered, that first set can be ignored if it falls outside the window (in k-space) which would be needed to filter and separate a second set of tags, and so on.

Enhancement 6A: Signed or complex image input may be utilized (i.e., not the usual magnitude reconstruction of complex signal). Then, the modulation range can exceed a 90° total tagging angle, for better dynamic range, while still using simple k-space filtering of the first sinusoidal harmonic in the tagging pattern.

Enhancement 6B: When the spatial domain images used are magnitude or real, as opposed to complex, then it is noted that the k-space data contains Hermitian symmetry. It is possible to take direct advantage of the fact that shift frequency bands at positive and negative frequencies are related by reflection about the center of k-space, and by complex conjugation. Thus, it is possible to perform alternate equivalent operations such as windowing only the positive shifted frequency band, performing a 2DFT on it, and then generate the equivalent shifted frequency results by taking the real part of the 2DFT result and multiplying it by 2. These variations derive from the basic mathematical properties of the Fourier transform, and are well known in the art.

Enhancement 6C: When the images used are complex, it is also possible to work with just one of the shifted frequency sidebands instead of both the positive and negative direction shifted frequencies. As one example, it is possible to use one sideband, either the positive frequency harmonic or the negative frequency harmonic, double its contribution, and not use the other shifted frequency sideband at all, while accepting some artifact or degradation in the resultant 2DFT spatial domain results. It is also possible to use known MRI reconstruction techniques for reconstruction of partial datasets, in a way which reduces the artifacts. For example, a low resolution phase map can be generated from the main low-pass frequency image, and this phase map can be used for correction when synthesizing an equivalent 2DFT spatial domain image corresponding to what would result from the negative sideband. These kinds of methods are well known in the MR literature, where they are commonly known as partial Fourier reconstructions, asymmetric k-space acquisitions, conjugate symmetry reconstructions, and the like.

Enhancement 7: At a major edge, such as the exterior of the body, there can be point-spread issues which differ between the high-pass and low-pass portions. This can lead to bad computed data for the flip angle or B1 in those areas. Similarly, this can occur near signal voids. One step in the processing can be to generate a mask to identify areas of very low signal, or very significant signal gradients, or both. Then an erosion operator may be used on the mask image, to remove edge regions in the B1 map, which may have larger error.

Enhancement 8: Besides the map of B1, a secondary map such as ρ can be generated, or a mask can be formed by thresholding of ρ, so that in subsequent operations using the B1 map, it is known for which pixels we have generated a reasonable estimate of B1, and for which pixels there is no such estimate available.

Enhancement 9: Relative amplitudes and/or relative phase of distinct RF transmit channels could be determined by an extension of this method. Consider a system with two transmit coils. The acquisition pulse sequence could be repeated two or three times. In a first repetition, a single transmit coil or channel could be used for both of the RF tagging pulses. In a second repetition, the two RF tagging pulses can be applied where one coil is used to transmit the first pulse of the tagging pair, and the second coil is used to transmit the second RF pulse of the tagging pair, in which phase-sensitive maps of the modulation (high-pass) components can be generated from each map.

Optionally, a third repetition can be performed in which the second coil is used for both pulses. From the basic phase difference of the two maps, one can compute the relative phase difference of the two transmit coils. Many different similar alternatives should be easy to conceive by one skilled in the art, such as extension to larger numbers of coils.

Enhancement 10: Tagging structures other than two-pulse SPAMM can be used (however, the sinusoidal modulation that arises from two-pulse SPAMM does correspond to a particularly easy case for filtering in k-space, and for demodulating). In particular, any pattern that has structure which is locally substantially periodic should be a candidate for filtering and separation in k-space.

Enhancement 11: The example diagram herein for processing shows the process beginning with magnitude images, then optionally performing a reverse transform to convert back to a k-space data representation. This can have certain practical advantages, such as implicitly allowing for use of auxiliary functions that are performed in a product reconstruction (combination of data from multiple receiver coils being one example). However, it is not necessary to convert to and from the image domain before filtering. An alternative is to directly apply window filtering and separation to the raw acquired k-space data, without first performing forward and backward transforms.

Enhancement 12A: Single-shot acquisition is a suitable choice for the imaging readout of this method (for example, single-shot EPI, or single-shot FSE, or as is available in Toshiba® MR application software, single-shot FASE). It is also reasonable, however, to use a multiple-shot imaging readout. If a multiple shot readout is used, then the preferred implementation is to allow the signal to recover from the tagging pulses, before re-applying the tag and collecting the next shot. For example, the recovery time could be in the range of three to four time constants of the typical range of T1 encountered in the tissues. This general advice would apply to any tagging analysis, and may not be specific to the k-space filtered analysis.

Enhancement 12B: If more than one shot is needed, or more than one image, then one can contemplate using a saturation and spoiling pulse directly after each imaging readout. This would enable faster readout, i.e., maybe somewhat faster than TR=T1, without leaving residual bias to the tag line intensities (the bias arising from unequal saturation and incomplete recovery). This general advice would apply to any tagging analysis, and may not be specific to the k-space filtered analysis.

Enhancement 13: When extending the technique from 2-D maps, to 3-D maps, 3DFT is a good choice if SNR is more limiting than motion. Alternately, sequential 2DFT acquisitions, separated by significant time for the tags to recover between each slice, is a good choice of an imaging readout sequence whenever control of patient motion is more critical than SNR. This general advice would apply to any tagging analysis, and may not be specific to the k-space filtered analysis.

Enhancement 14: If windowing of the central lobe and shifted replicants is done in one dimension, then signal energy from distant areas of k-space may appear in the wrong window. This may lead to artifacts, such as diagonal edges in the B1 map exhibiting a stair-stepping pattern or local superimposed "zebra stripes". One simple way to reduce the relative error from signal being included in the wrong window is to apply a filter or window along the opposite direction in k-space. The result is a 2-D window or filter as depicted in FIG. 5.

Near the center of one replicant echo, for example, the power of the signal from the modulated signal part will greatly exceed the power of the other two parts (unmodulated part, and other replicated part with whose frequencies have the opposite sign). But at farther distances in k-space, the error signal from the other parts becomes comparable to, or possibly even greater than, the power from the correct modulated part. Thus, these more distant areas contribute relatively more error, and should have reduced weighting or should be completely windowed out of the individual processing of the individual components.

Another method to reduce error is simply to acquire fewer lines of k-space.

Figure 5:
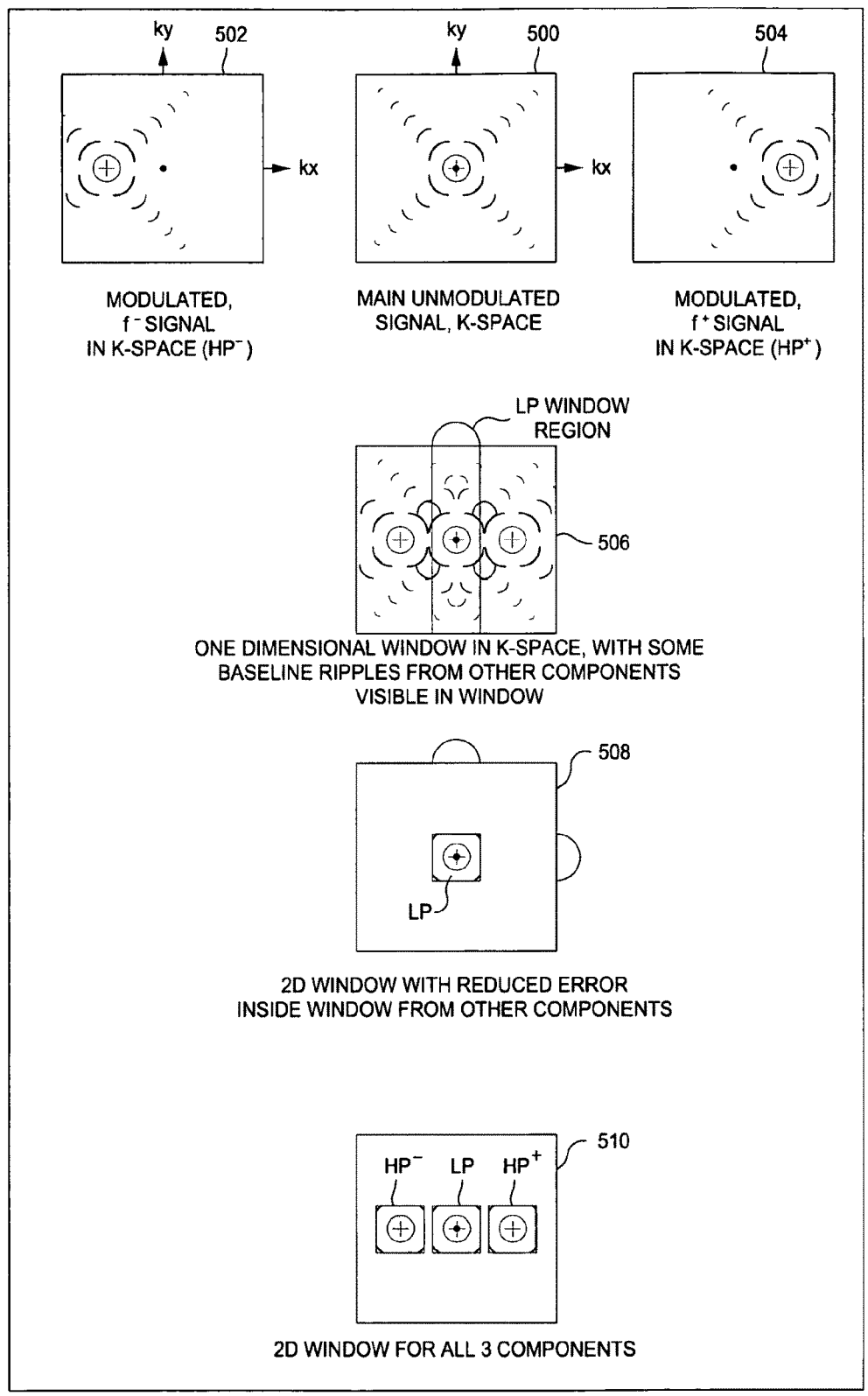
FIG. 5 is a schematic diagram of k-space filtering utilized in an alternative embodiment.

As depicted in FIG. 5, the main unmodulated base band signal 500 appears shifted to the left for a first "negative" harmonic at 502, and shifted equally to the right at 504 for the first harmonic modulated "positive" signal in k-space. The diagonally extending hash marks from each of the principle lobes (depicted by circled crosses or plus signs) can thus be seen to extend into the center window region at 506 from the upper and lower side bands or harmonics. Accordingly, to help diminish this unwanted effect, a 2-D window rather than complete strip of k-space can be employed at 508 so as to filter out at least some of the interfering ripples from adjacent side bands/harmonics. Similar 2-D windows (e.g., rectangular, square, circular, etc.) can be utilized for all three components of frequency filtering in k-space as depicted at 510 in FIG. 5.

Enhancement 15A: The distant k-space signal from one signal component (i.e., from the unmodulated-component, or from the modulated-positive-frequency-component, or from the modulated-negative-frequency-component) can appear inside the main filtering window of another component (as also mentioned in enhancement or alternate embodiment 14). This signal can be thought of as a kind of baseline ripple, upon which the correct signal component is added. If the baseline ripple can be reduced or removed, then the artifact will be reduced or removed. We now describe four technical ways to reduce or remove the "baseline" ripple.

Figure 6:
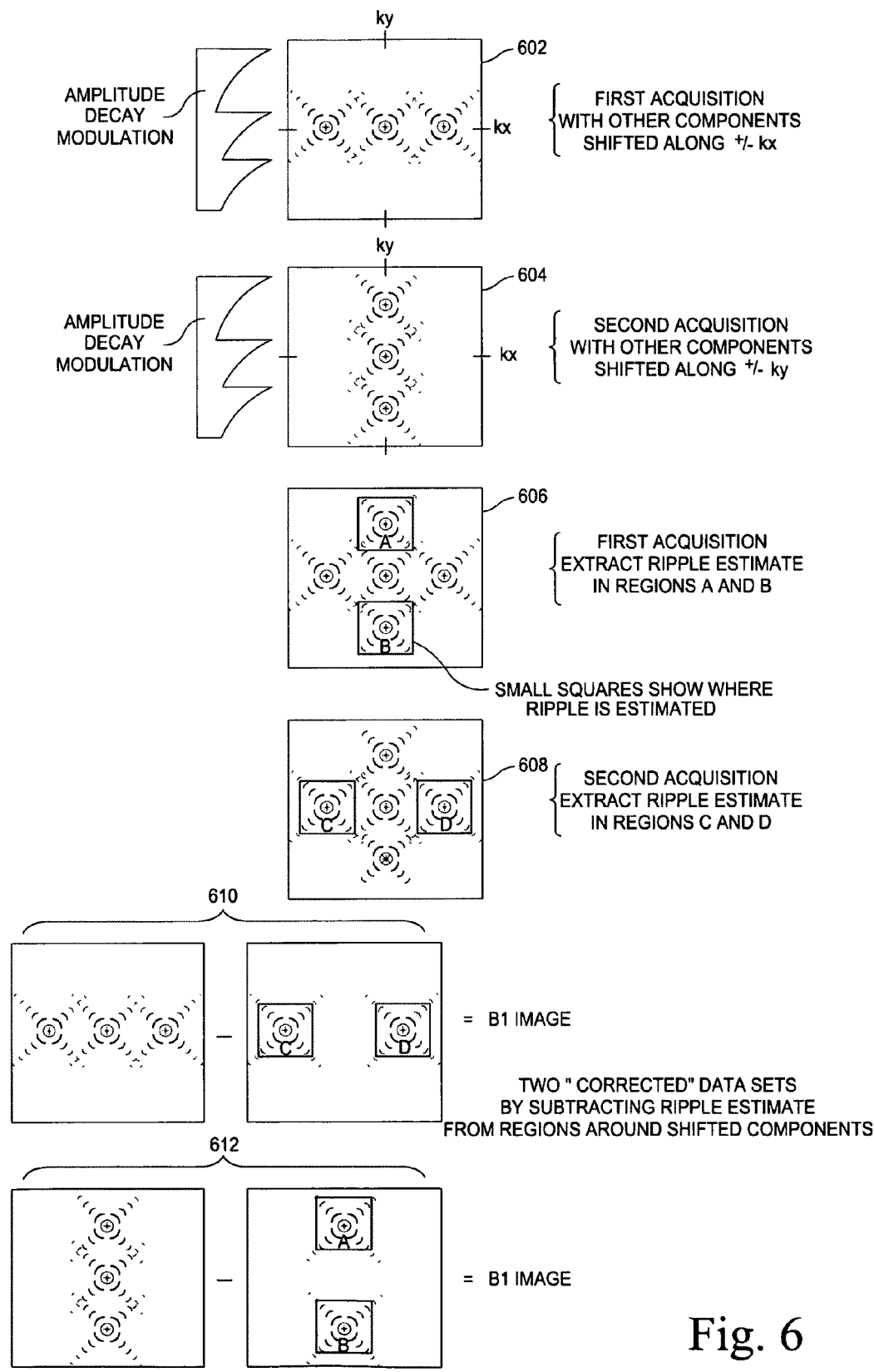
FIG. 6 is also a schematic diagram of k-space frequency filtering utilized in an alternate embodiment.

Enhancement 15B: As depicted in FIG. 6, one can collect one tagged acquisition with the tags oriented in one direction (e.g., as in 602 with the tagging gradient along the X direction for a transversely oriented B1 map), and also collect a second tagged image, with the tags oriented along the opposite in-plane direction as in 604, that is along the Y direction. With the two acquisitions in the two directions, replicants will occur with data at four locations, i.e., +kx, −kx, +ky and −ky. Select the scan parameters, including, for example, the k-space echo order and the phase encoding direction, so that as much as possible within reason, the echo decay at the same locations in k-space is the same. When the tagged components are shifted along the (plus-or-minus) kX direction, save a copy of the baseline ripple as detected by the windows situated at the (plus or minus) ky-shifted locations at depicted at 606. When, in the other acquisition, the tagged components are shifted along the (plus-or-minus) kY direction, save a copy of the baseline ripple as detected by the windows situated at the (plus or minus) kx-shifted locations. Subtract a copy of the measured baseline ripple in each shifted window from the acquired modulated signal in that same window as shown at 610, 612, to at least partially reduce the baseline ripple. Combine the maps from the two corrected acquisitions.

If the sequence uses an echo train-based readout technique (EPI, FSE, FASE, etc.), multiple shots of segmented k-space should be used. Here, the choice of phase encode schedule per shot is important. The phase encode schedule dictates the amplitude decay modulation function. In the first acquisition (tag along X), by acquiring the readout direction along the same direction of the shift (+/−kx), the central low frequency component and outer high frequency components are centered within the same position of the amplitude decay modulation function. All components experience the same amplitude decay modulation. In the second acquisition (tag along Y), the phase encode direction must be the same as the first acquisition. Only the direction of the shift should change (to +/−ky). The components must all be centered in the same positions of the phase encode schedule within each segment. The segment size, phase encode schedule and/or tag cycle spacing must be chosen accordingly. Therefore, for the technique of baseline removal, if using an echo train readout method, the number of shots (segments) might naturally be a multiple of 3. A separate shot can be used for each component in the second acquisition to ensure that the component is centered in the amplitude decay function the same way. In this way, the ripple estimate regions of interest (A, B, C, D in FIG. 6) and the shifted components are all affected by the same amplitude decay modulation function in the same way. Since the ripple estimate regions have the same amplitude decay modulation as their corresponding shifted components, a direct subtraction can be performed.

Enhancement 15C: As in 15A, collect data with two (or more) orientations of the tag data. Generate an uncorrected B1 map from each acquisition. Combine the images on a pixel-by pixel basis, such as by simple averaging, or by performing a weighted combination, with preferential weighting at each location in image space for the B1 map which has the least high-frequency content potentially interfering with the tagging modulation patterns of each tagging orientation.

Enhancement 15D: Collect one copy of the acquisition with tags, and one without tags. Note the location where filter windows are placed over the shifted signal components with modulated signal in k-space. From corresponding locations of windows over the untagged scanned k-space data, extract copies of the high frequency k-space data (these would be the baseline ripples). Optionally, determine an amplitude factor, showing how the central untagged component of the data has reduced overall amplitude in the k-space. Subtract the baseline ripple estimates (optionally multiplied by the factor for reduced amplitude). Proceed with the rest of the map generation process.

Figure 7A:
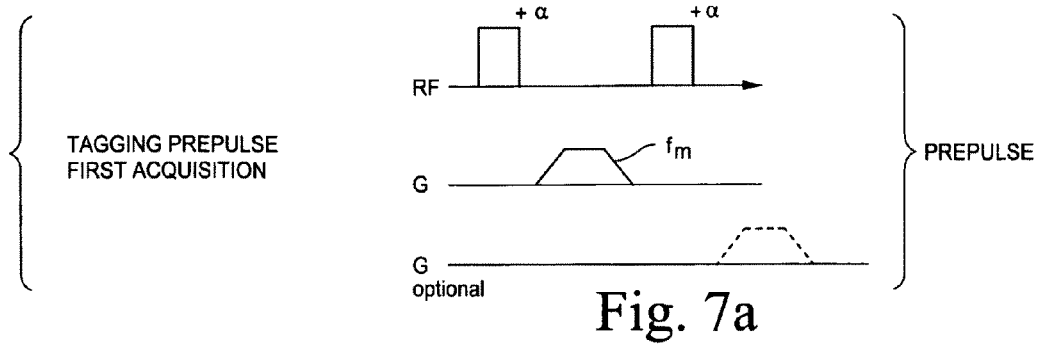
FIG. 7 is a schematic diagram of an exemplary "phase cycling" embodiment utilizing first and second data acquisition cycles with different tagging pre-pulse sequences followed by combination of the resulting k-space data sets so as to produce an improved "starting" k-space data set.
Figure 7B:
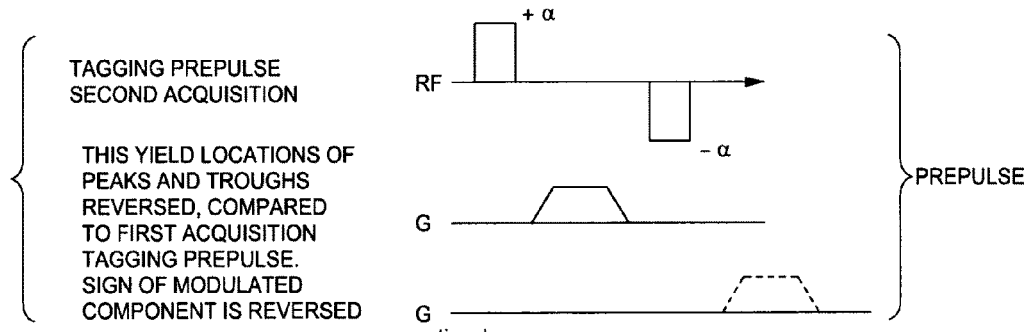

Enhancement 15E: Collect two acquisitions, each of which could be used to generate a B1 map. The first acquisition pre-pulse sequence shown in FIG. 7a is as previously described for FIG. 2. However, in the second acquisition at FIG. 7b, the sequence is modified so that the spatial locations of the peaks and troughs in the (sinusoidal) tagging pattern are reversed. This may be done by inverting the polarity or phase of one of the two RF tagging pulses. Suppose the first acquisition has a tagging sequence which is symbolically denoted as (+αRF, Gtag_encode, +αRF). Then the second acquisition can have a sequence which is symbolically denoted as (+αRF, Gtag_encode, −αRF).

Figure 7C:
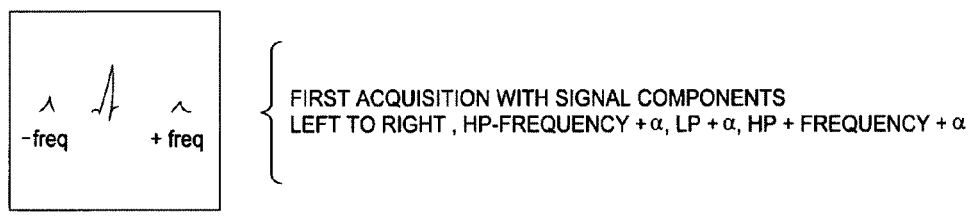
Figure 7D:

Extract the three components from each of the two acquisitions (as shown, respectively, at FIGS. 7c and 7d in which these six components are labelled as LP+alpha, LP−alpha, HP+alpha+freq, HP−alpha+freq, HP+alpha−freq, HP−alpha−freq where the part of the label either "+alpha" or "−alpha" refers to which RF polarity is used in the two acquisitions. Then, form some combinations by additions and subtractions:

LP=(LP+alpha)+(LP−alpha)

HP+freq=(HP+alpha+freq)−(HP−alpha+freq)

HP−freq=(HP+alpha−freq)−(HP−alpha−freq)

where LP is the low-pass (or unmodulated) component, and HP+freq and HP−freq are components which are modulated (high-pass) and shifted to positive and negative frequency displacements.

This phase cycling scheme causes cancellation of the baseline ripple. Other variants of phases will be obvious to those skilled in the art, i.e., they are corrected so as to have the contribution from the unwanted signal removed.

Proceed with the rest of the map generation process.

Figure 8:
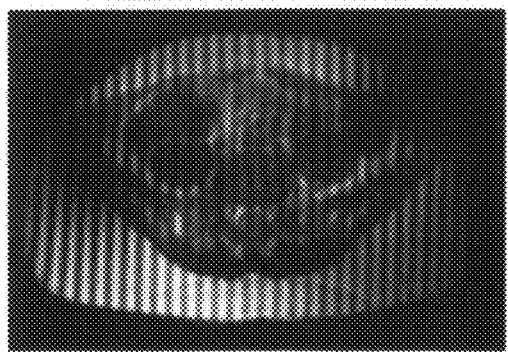
FIG. 8 is an image of a human pelvis with visible spatial modulation tagging lines superimposed thereon from use of a pre-pulse tagging sequence.
Figure 9:
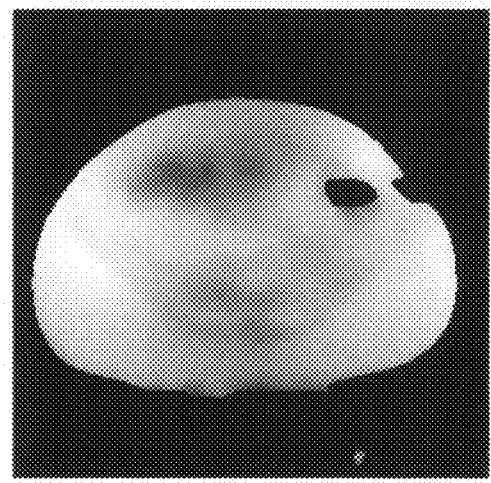
FIG. 9 is a B1 map generated from the tagged image of FIG. 8.
Figure 10:
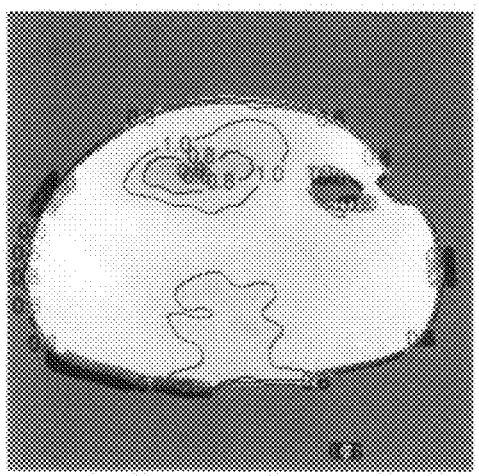
FIG. 10 is a normalized B1 map from FIG. 9 with superimposed contour lines depicting variations in B1 effective magnitude across the human pelvis.

FIGS. 8, 9 and 10 are photographs of a particular implementation of alternative 15E. Here, FIG. 8 shows the spatial domain image of a pelvis with the tagging lines shown. FIG. 9 is a normalized nutation angle θ map generated from the tagged image of FIG. 8. FIG. 10 shows the θ map of FIG. 9 with superimposed contour lines where 1.0 means measured total tip angle matches what was nominally specified, 0.80 means that the tip angles are 20% below that which was nominally specified, etc.

SPAMM tagging by the use of binomial 1-1 pulses makes for easy computation, ignoring relaxation effects. In the under-tipped saturation case, local minima and maxima are detected in similar tissue, making it easy to solve for RF tip angles at each pixel:

$$R = \left( \frac{saturatedSignalMin}{unsaturatedSignalMax} \right)$$

$$tipAngle = 0.5 \times \arccos(R)$$

where:
tipAngle=angle of one (square) RF pulse in the tagging pre-pulse. Then the net saturation effect of pair of RF pulses in the single pre-pulse varies spatially from 2*tipAngle down to zero.

An alternate form of equation for calculating the tipAngle is based on fractionOfSaturation FS=1−R where tipAngle=0.5 arc sin (FS). Yet more forms of inverse trigonometric relationships can be listed, acting upon other simple functions of the various images, but they are all mathematically equivalent.

Figure 11A:
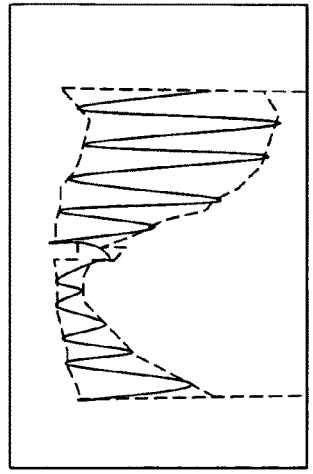
FIGS. 11a-11f graphically depict pixel values across a line of image data illustrating how SPAMM tagging ultimately produces peak and valley envelope data needed for subsequent computation of B1 field values.
Figure 11C:
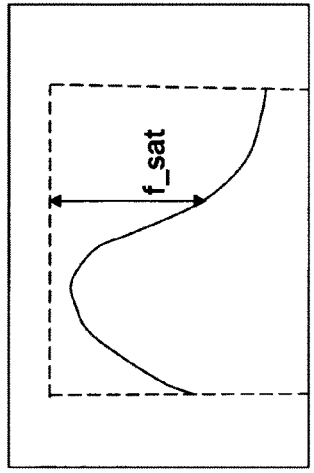
Figure 11E:
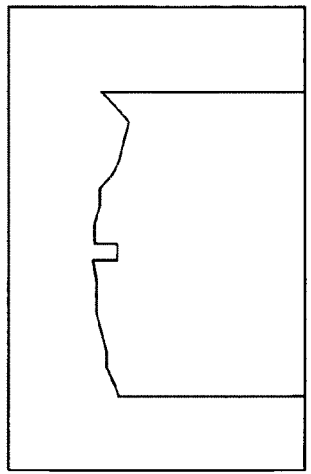
Figure 11B:
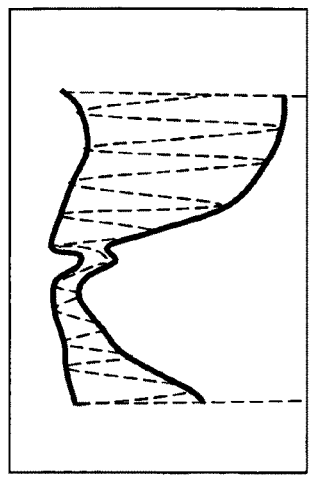
Figure 11D:
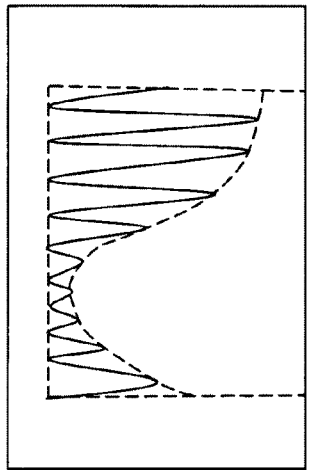
Figure 11F:
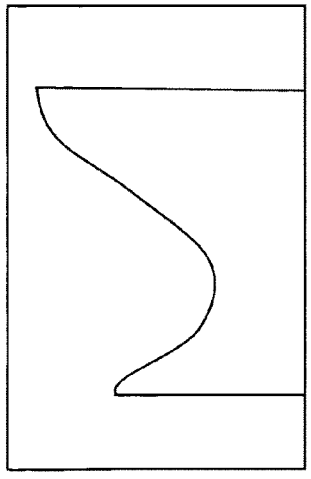

As shown in FIG. 11a, an untagged image will provide pixel values along a line therethrough. Inside the magnet and the subject, the RF coils generate a transmit field, which has a spatial distribution as represented in FIG. 11b. The two tag RF pulses in the SPAMM pre-pulse are capable of generating a tagging strength, with a fraction of saturation "f_sat" as illustrated in FIG. 11c. The tagging gradient inside the SPAMM pre-pulse, however, causes an actual tag spatial profile with a nominally sinusoidal profile, as illustrated in FIG. 11d. The intensity of spins immediately in the SPAMM image is then shown in FIG. 11e, where the tagged image is the multiplicative product of the untagged image and the tag spatial profile. An intermediate goal for some of the processing steps within the entire B1 tagging k-space method described herein is to recover good estimates of upper and lower envelopes.

Estimating the envelopes can yield intermediate useful results as illustrated by the bold lines in FIGS. 12a and 12b, but these will really be 2-D images/surfaces, not just 1-D curves as depicted.

Here:

PeakEnvelope=Lowpass+Bandpass_Demodulated

ValleyEnvelope=Lowpass−Bandpass_Demodulated

FractionOfSaturation=1−(ValleyEnvelope/PeakEnvelope)

where the depicted bandpass and low-pass are effected in k-space, the demodulation is effected in image space (by taking magnitude). The bandpass data might be termed either "bandpass" or "high-pass" data.

As depicted in FIGS. 13a-13c, partial amplitude modulation produces two shifted "replicants" in k-space. Here, FIG. 13a depicts how k-space looks for the untagged image. FIG. 13b shows a simple tag spatial profile. Applying the tag spatial profile onto the untagged image or untagged k-space results in the reduction of the central lobe, plus the generation of the left and right lobe (shifted) replicants. Amplitudes of the shifted replicants depend on:

$f$=FractionOfSaturation/2 (e.g., assume: $0.0 <= f <= 0.5$).

Figure 14:
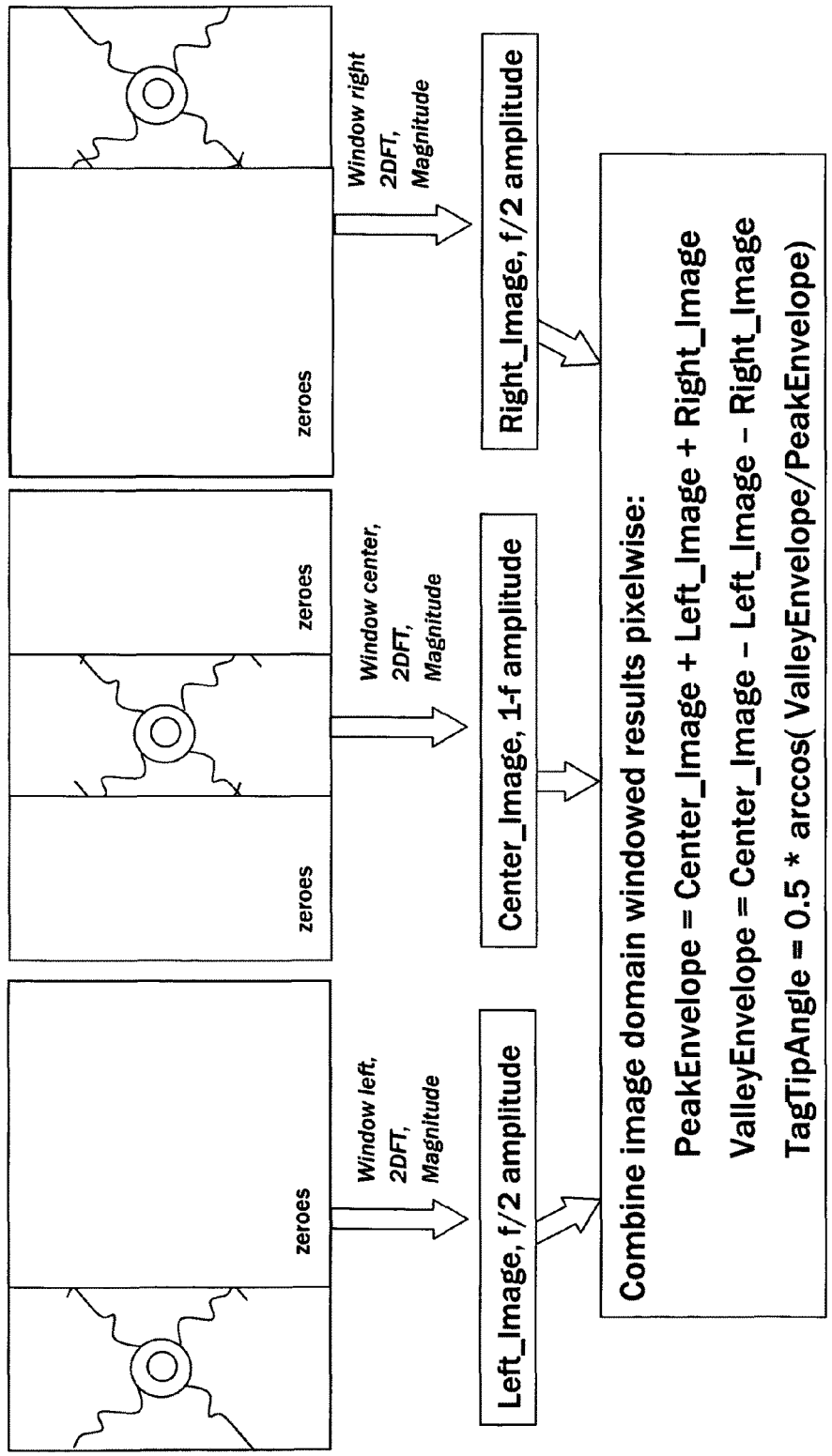
FIG. 14 depicts exemplary processing of k-space data to produce a B1 field map.

FIG. 14 illustrates an exemplary program code structure for data acquisition, filtering and processing of k-space data to produce a B1 field map. This is an alternate representation of the k-space tag processing, similar to that described in relation to FIG. 3 or 4.

However, there is a difference between using sines and cosines, in image space or in k-space. Suppose an image exhibits cosine-like behavior (symmetric about the center). Then all of the k-space signal is real and symmetric. But if the image exhibits sine-like behavior (anti-symmetric about the center), then all of the k-space signal is imaginary and anti-symmetric.

Recall that sines and cosines with arbitrary initial phase angles can be written as a sum of sines and cosines with zero initial phase angles. This is basic trigonometry, and also very well known in complex variables, and very well known in dealing with Fourier transforms.

The basic result is that the sine-like component of the modulated waveform will show up as anti-symmetric and imaginary parts in the k-space replicants and the cosine-like components will be real and symmetric in the two k-space components. Therefore, the relative amounts of real and imaginary portions of the k-space replicants are directly related to the relative amounts of sine-like and cosine-like components in the "bandpass" image data.

The physical meaning of "initial phase" in the tagging grid can also be considered. Suppose signal is perfectly on-resonance, and suppose two square SPAMM RF pulses are of the same polarity. Then, at gradient isocenter, those pulses will act in unison and the net effect is maximal saturation. The net effect is a "valley" at isocenter where the signal in the bandpassed (high-passed) image is real and negative (before taking the magnitude).

If instead there is accumulated phase of 180 degrees (due to gradients, or off-resonance, etc.), then the net effect is zero saturation at isocenter and a peak of the tagged image will occur at isocenter. The signal in the bandpassed (high-passed) image is real and positive (at isocenter) (before taking the magnitude of the complex quantity.)

In either of these cases, the two replicants in k-space are symmetric compared to each other.

If instead 90 or −90 or 270 or −270, etc. degrees of phase accumulates from the first alpha pulse to the second alpha pulse, then one is at middle amplitude, which is exactly what is fully captured in the "low-passed" central replicant. The two left and right lobe replicants in k-space are anti-symmetric compared to each other.

Tag lines can be locally misplaced or "bent" where off-resonance is more significant. For example, generally near air or body cavities, susceptibility may cause off-resonance.

Suppose the majority of the image is essentially on-resonance (i.e., a majority of the B1 and B0 fields are uniform). But in areas where the signal is off-resonance, the tagging grid will now be locally shifted. This distortion can be thought of in at least three related ways: (1) The image-domain lines can be seen as bent or displaced. (2) Sinusoidal patterns convert to cosine patterns (i.e., anti-symmetric and symmetric with respect to some center) and vice versa. (3) The complex phase of various signals is converted from real to imaginary and vice versa (which can be seen either in the image domain or the k-space domain, if the signal has not been converted to magnitude in that domain).

Figure 15:
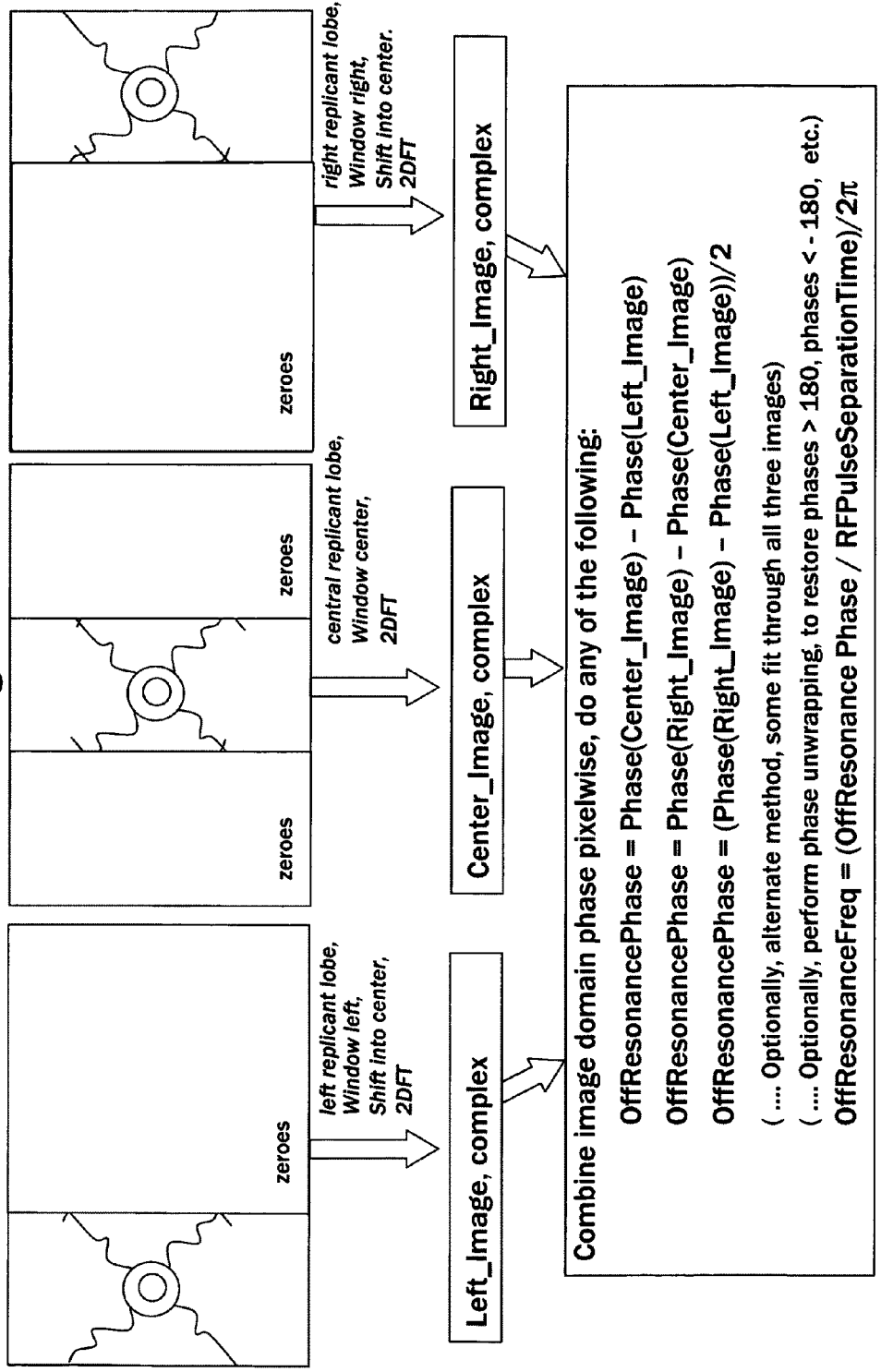
FIG. 15 depicts exemplary processing of k-space data to produce a B0 field map.

Now it is also possible to convert a signal's complex phase into an amount of off-resonance, i.e., a B0 map. A simple way to do so uses most of the same processing steps as already explained for B1 processing. Program code for effecting B0 map processing of windowed replicants in k-space is depicted graphically in detail at FIG. 15.

Figure 16:
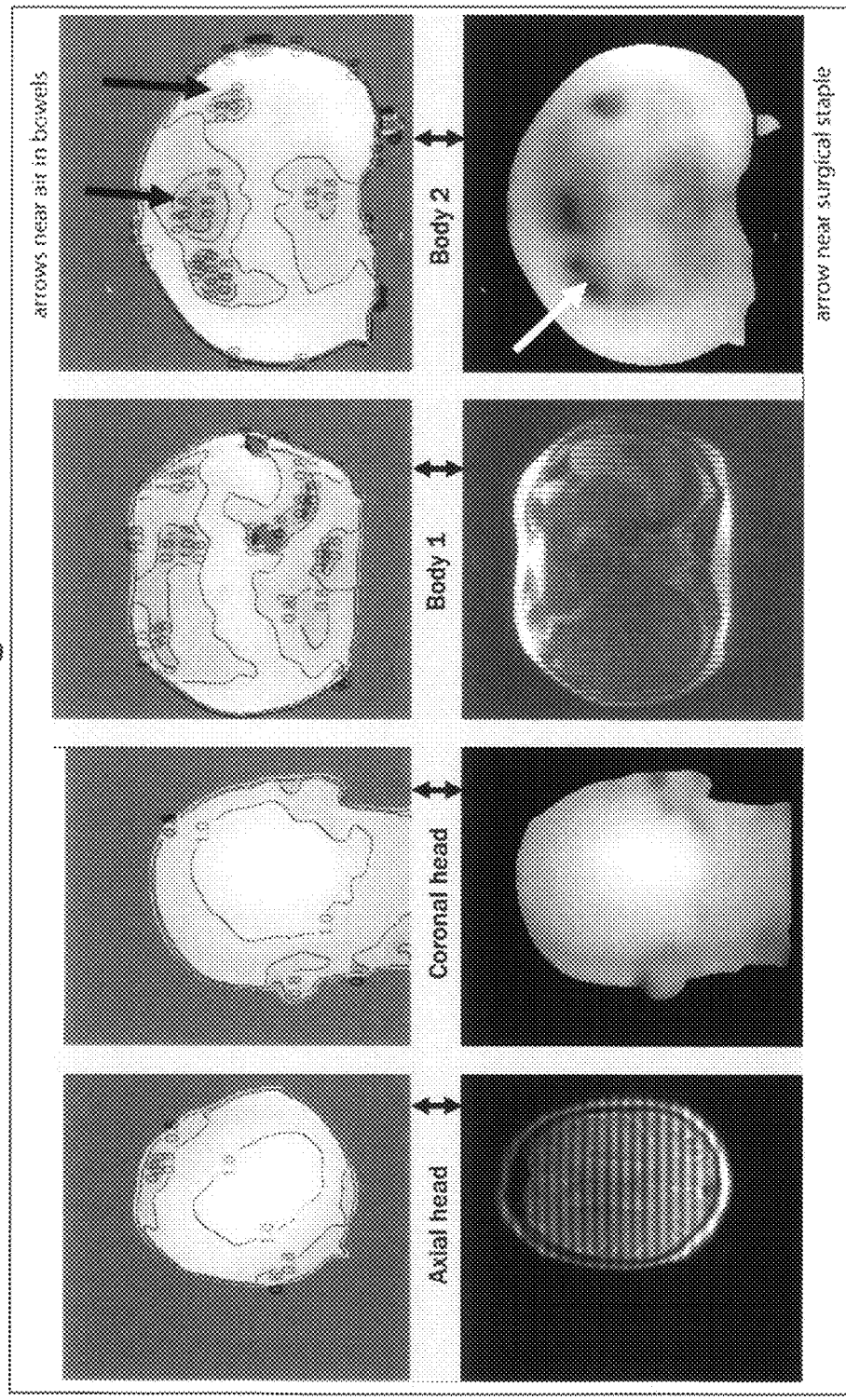
FIGS. 16-17 provide exemplary B1 maps produced by the processes described herein.
Figure 17:
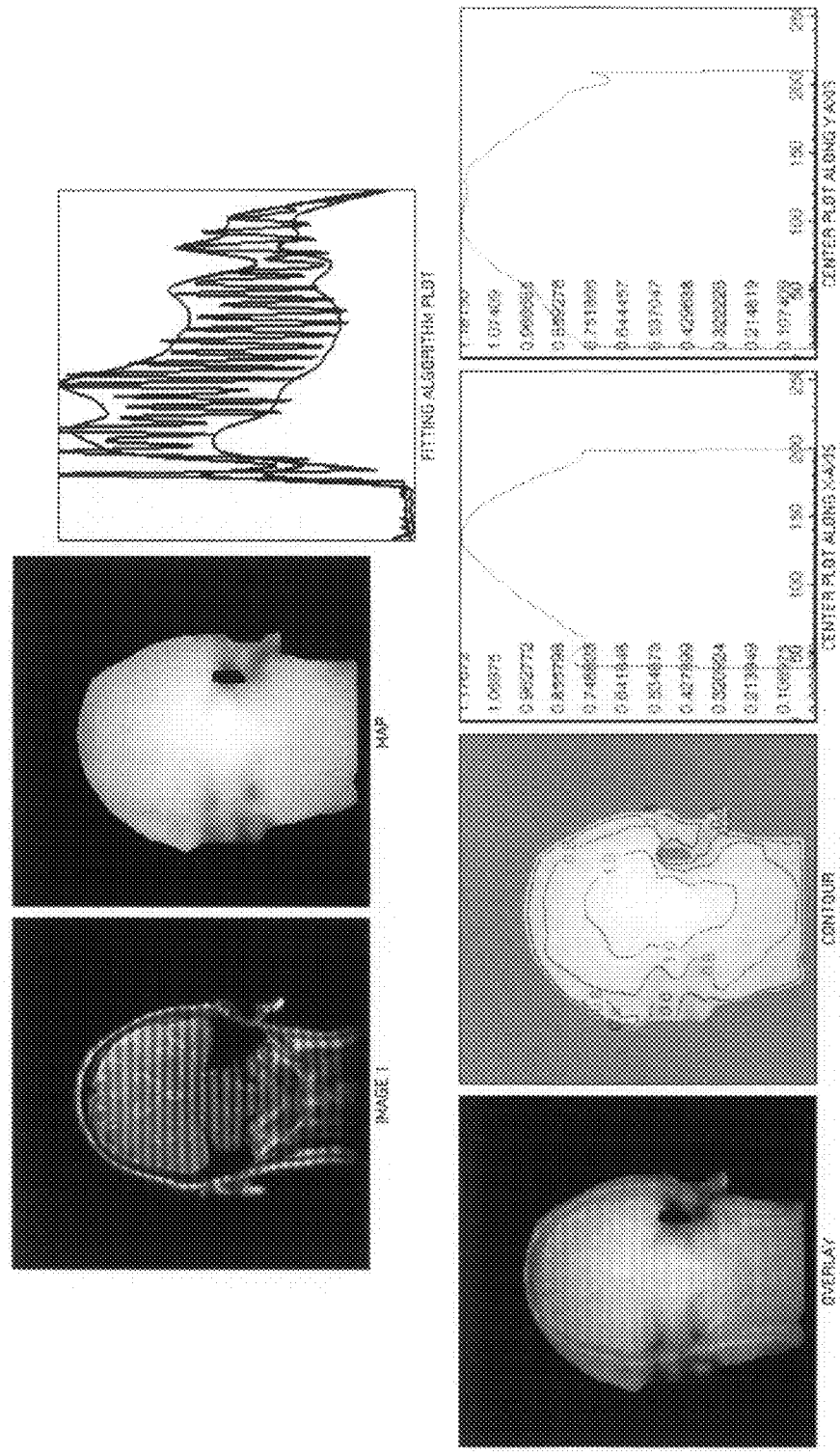
Figure 18:
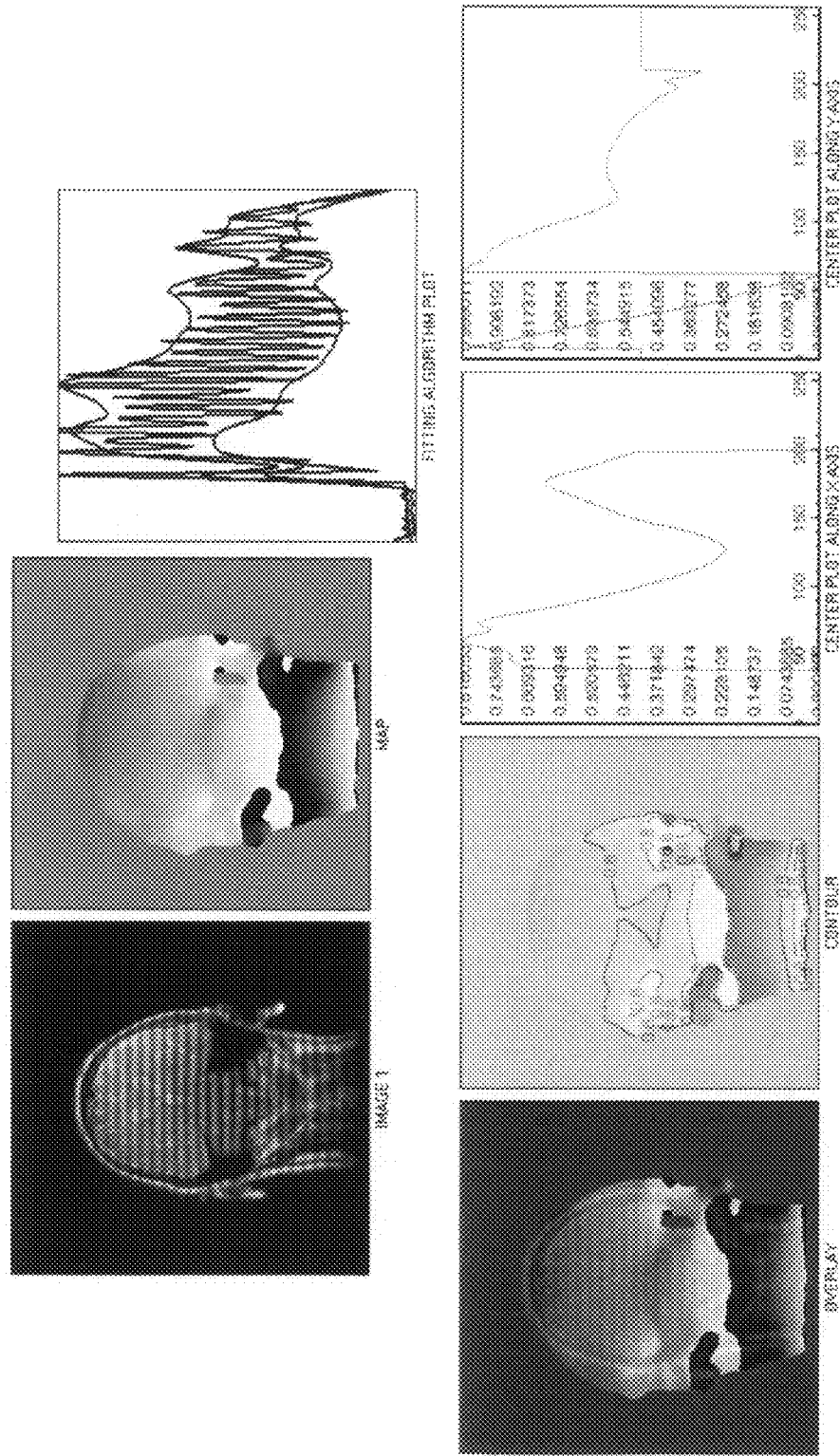
FIG. 18 provides an exemplary B0 map produced by the processes described herein.

FIGS. 16, 17 and 18 show exemplary B1 and B0 maps produced by the above-described processes. Some practical details associated with the generation of these exemplary images include: use the existing conventional magnitude image reconstruction of the scanner, employ necessary support for partial Fourier transforms, array coil combination, etc., then back-transform to idealized k-space.

Typical readout pulse sequence parameters are FSE2D, partial Fourier transform, TE 39, TR 2250, EchoSpacing 6.5 msec, 54 echo train length, 2 shots per image, 2 tag polarities, 4 imaging shots, total acquisition time is 12-14 seconds including FSE calibration pre-scan, readout resolution 192×256 samples, and B1 map resolution up to 192×85 (since 85 approximately equals 256/3 windows).

When this is done, left and right satellites, sidelobes, replicants (by whatever name) have identical mathematical content—one is the mirror image of the other with complex conjugation (Hermitian symmetry).

Therefore, it would be equivalent in B1 map synthesis to use magnitude(2×Left), or to use magnitude(2×Right), in place of (magnitude(Left)+magnitude(Right)).

It is also now possible to use the B0 map to effect a B0 correction to a B1 map. For RF tag pulses, note that the effective strength of a square pulse is reduced by off-resonance effects. It is possible to keep this effect small by using short pulse durations etc., so it may or may not be significant. But it is also possible, once a B0 (or "off-resonance") map is available, to directly correct for that effect, thereby improving the B1 map.

If, for example, one square pulse has a duration of 100 microseconds, at 3 T, and a pre-pulse is applied on-resonance for water, then the uncorrected error in applied tip angle at +/−420 Hz (i.e., at fat), is about 1.2% (at fat). Off-resonant signals experience under-tipping so one would get underestimates of the B1 map by a comparable order of magnitude.

In a standard linear domain approximation, and ignoring relaxation, if one RF square pulse has the form B*rect(t/Δt), i.e., the duration of the pulse is Δt, then the tip angle on-resonance is B(Δt) and the tip off-resonance is BΔt(sinc(ΔtΔf) or BΔt(sin(πΔtΔf))/(πΔtΔf)

where t and Δt are in seconds and Δf is in cycles/second. Thus degradation of tip angle as a function of Δf is then:

tip(Δf)/tip(onResonance)=sinc(ΔfΔt)=sin(πΔfΔt))/(πΔfΔt).

Therefore, B1 maps can be corrected:

B1corr=B1uncorr/sinc(ΔfΔt) and Δf is the result, in Hz, from the B0 map.

Extension of these methods to 3-D mapping is limited by the persistence of previous tags. Simplistic multislice interleaving fails, since all tag pre-pulses project through the whole volume. A 3-D application may need either TR>T1 with no interleaving or a true 3-D single-shot readout.

While certain embodiments of the invention have been described, these embodiments have been presented by way of example only, and are not intended to limit the scope of the invention. Indeed, the novel methods and systems described herein may be embodied in a variety of other forms; furthermore, various omissions, substitutions and changes in the form of the methods and systems described herein may be made without departing from the spirit of the invention. The accompanying claims and their equivalents are intended to cover such forms or modifications as would fall within the scope and spirit of the invention.

What is claimed is:

1. A method for generating a B0 map in an MRI system, said method comprising using an MRI system to:
    (a) acquire at least one set of amplitude tagged MRI data signals in spatial frequency domain k-space from MR nuclei within an imaged volume of the MRI system;
    (b) process said k-space data with at least one data processor in order to produce at least two sub-sets of frequency-filtered k-space data including at least two of:
        (i) a baseline low-frequency sub-set,
        (ii) a positive higher frequency sub-set including a harmonic version of said baseline sub-set, and
        (iii) a negative higher frequency sub-set including a harmonic version of said baseline sub-set;
    (c) separately Fourier transform each of said at least two sub-sets in order to produce at least two respectively corresponding complex-valued spatial domain data sets;
    (d) arithmetically combine said at least two complex-valued spatial domain data sets on a pixel-by-pixel basis in order to generate and provide an off-resonance phase set of pixel data representing a B0 map value; and
    (e) store said B0 map values in a non-transitory computer accessible and readable memory device that is subsequently usable by said MRI system.

2. A method for generating a B0 map as in claim 1, wherein step (d) comprises:
    calculating a difference value between the complex phases of said at least two complex-valued spatial domain data sets on a pixel-by-pixel basis in order to generate and provide an off-resonance phase set of pixel data representing a B0 map value.

3. A method for generating a B0 map as in claim 2, wherein said at least two complex-valued spatial domain data sets comprise:
    (i) a 2DFT of said baseline low-frequency sub-set, and
    (ii) a 2DFT of one of said positive and negative higher frequency sub-sets.

4. A method for generating a B0 map as in claim 2, wherein said at least two complex-valued spatial domain data sets comprise:
    (i) a 2DFT of said positive higher frequency sub-set and
    (ii) a 2DFT of said negative higher frequency sub-set.

5. A method for generating a B0 map as in claim 1, wherein said sub-sets of frequency-filtered k-space data comprise windowed k-space data from substantially equally-sized windows.

6. A method for generating a B0 map as in claim 5, wherein each of said windows comprises no more than one-third of k-space data.

7. A method for generating a B0 map as in claim 1, and further comprising:
    generating a B1 map using at least two of said sub-sets of frequency-filtered k-space data; and
    correcting said B1 map using said B0 map.

8. A method for generating a B0 map as in claim 1, wherein said amplitude tagged MRI data signals are generated using phase-cycled tagging pulse pairs, wherein the polarity of an RF tag pulse is reversed in one pair of tagging pulses as compared to another pair of tagging pulses, thereby improving the selectivity of signals appearing in said frequency-filtered k-space data.

9. A non-transitory computer-readable storage medium containing computer program code which, when executed, effects the method of claim 1.

10. An MRI system comprising:
    an MRI scanner configured to acquire at least one set of amplitude tagged MRI data signals in spatial frequency domain k-space from MR nuclei within an imaged volume of the MRI system; and
    at least one processor configured to:
        process said k-space data in order to produce at least two sub-sets of frequency-filtered k-space data including at least two of:
            (i) a baseline low-frequency sub-set,
            (ii) a positive higher frequency sub-set including a harmonic version of said baseline sub-set, and
            (iii) a negative higher frequency sub-set including a harmonic version of said baseline sub-set;
        separately Fourier transform each of said at least two sub-sets in order to produce at least two respectively corresponding complex-valued spatial domain data sets;

arithmetically combine said at least two complex-valued spatial domain data sets on a pixel-by-pixel basis in order to generate and provide an off-resonance phase set of pixel data representing a B0 map value; and store said B0 map values in a non-transitory computer accessible and readable memory device for subsequent use by said MRI system.

11. An MRI system as in claim 10, wherein said arithmetic combination comprises: calculating a phase difference value between said at least two complex-valued spatial domain data sets on a pixel-by-pixel basis in order to generate and provide an off-resonance phase set of pixel data representing a B0 map value.

12. An MRI system as in claim 11, wherein said at least two complex-valued spatial domain data sets comprise
   (i) a 2DFT of said baseline low-frequency sub-set, and
   (ii) a 2DFT of one of said positive and negative higher frequency sub-sets.

13. An MRI system as in claim 11, wherein said at least two complex-valued spatial domain data sets comprise
   (i) a 2DFT of said positive higher frequency sub-set, and
   (ii) a 2DFT of said negative higher frequency sub-set.

14. An MRI system as in claim 10, wherein said sub-sets of frequency-filtered k-space data comprise windowed k-space data from substantially equally-sized windows.

15. An MRI system as in claim 14, wherein each of said windows comprises no more than one-third of k-space data.

16. An MRI system as in claim 10 and further configured to: generate a B1 map using at least two of said sub-sets of frequency-filtered k-space data; and correct said B1 map using said B0 map.

17. An MRI system as in claim 10, wherein said amplitude tagged MRI data signals are generated using phase-cycled tagging pulse pairs, wherein the polarity of an RF tag pulse is reversed in one pair of tagging pulses as compared to another pair of tagging pulses, thereby improving the selectivity of signals appearing in said frequency-filtered k-space data.

* * * * *